(12) United States Patent
Horio

(10) Patent No.: US 6,712,529 B2
(45) Date of Patent: Mar. 30, 2004

(54) INFRARED DATA COMMUNICATION MODULE AND METHOD OF MAKING THE SAME

(75) Inventor: Tomoharu Horio, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 10/015,016

(22) Filed: Dec. 10, 2001

(65) Prior Publication Data

US 2002/0094177 A1 Jul. 18, 2002

(30) Foreign Application Priority Data

Dec. 11, 2000 (JP) ........................................ 2000-375438
Dec. 15, 2000 (JP) ........................................ 2000-382002

(51) Int. Cl.⁷ .............................................. G02B 6/36
(52) U.S. Cl. ............................ 385/92; 385/14; 385/88; 385/94; 359/350; 398/140; 398/164; 264/1.1; 438/26; 438/27; 257/98
(58) Field of Search ................................ 385/14, 88–94; 359/154, 350; 398/140, 164; 438/26, 27, 65; 257/E31.127, 98; 264/1.1, 1.24

(56) References Cited

U.S. PATENT DOCUMENTS

| | | | | |
|---|---|---|---|---|
| 4,599,537 A | * | 7/1986 | Yamashita ................... 313/501 |
| 5,546,489 A | * | 8/1996 | Sasaki et al. ................... 385/88 |
| 5,665,983 A | * | 9/1997 | Nagano ......................... 257/81 |
| 6,060,729 A | * | 5/2000 | Suzuki et al. ................... 257/99 |
| 6,170,996 B1 | * | 1/2001 | Miura et al. .................... 385/94 |
| 6,318,908 B1 | * | 11/2001 | Nakanishi et al. ............. 385/89 |
| 6,332,720 B1 | * | 12/2001 | Shimaoka ...................... 385/88 |
| 6,530,698 B1 | * | 3/2003 | Kuhara et al. ................. 385/88 |
| 6,548,328 B1 | * | 4/2003 | Sakamoto et al. ........... 438/121 |
| 6,558,970 B2 | * | 5/2003 | Sakamoto et al. ............. 438/22 |
| 2002/0126356 A1 | * | 9/2002 | Nakanishi et al. ........... 359/163 |
| 2002/0154667 A1 | * | 10/2002 | Shimonaka ................... 372/50 |

* cited by examiner

Primary Examiner—Brian Healy
Assistant Examiner—Daniel Petkovsek
(74) Attorney, Agent, or Firm—Merchant & Gould P.C.

(57) ABSTRACT

An infrared data communication module (A) includes a substrate (1) having a surface (1a) for mounting a group (E) of components including a light emitting element (2), a light receiving element (3) and an IC element (4), and a molded body (5) formed of a molding resin to cover the entire surface (1a) of the substrate (1) for sealing the group (E) of components. The surface (1a) of the substrate (1) is formed with one or a plurality of jumper pads (11a, 11b) formed by plating a conductive film with gold. Each jumper pad (11a, 11b) is partially or entirely spaced from an edge of the substrate.

6 Claims, 20 Drawing Sheets

INFRARED DATA COMMUNICATION MODULE AND METHOD OF MAKING THE SAME

TECHNICAL FIELD

The present invention relates to an infrared data communication module used for performing infrared data communication by IrDA (Infrared Data Association) method.

BACKGROUND ART

Infrared data communication modules (hereinafter simply referred to as "module") based on the IrDA are increasingly used for notebook-size personal computers, and recently also for mobile phones and electronic organizers. A module of this kind incorporates, in one package, not only an infrared light emitting element and an infrared light receiving element but also an IC chip for controlling these elements for enabling wireless communications between the above-described electronic apparatuses or between such an apparatus and a peripheral device such as a printer. In such a module, the communication speed and the communication distance are standardized in accordance with the versions, and attempts are being made to enhance the infrared data communication performance. On the other hand, there is an increasing demand for a size-reduction of the module, as a whole. Further, the manufacturing process requires a high dimensional accuracy and a cost reduction.

A prior art infrared data communication module of this kind is shown in FIG. 17. FIG. 18 illustrates the internal structure of the infrared data communication module of FIG. 17, whereas FIG. 19 is a sectional view taken along lines XIX—XIX of FIG. 17. As shown in FIG. 17, the prior art module 100 comprises a substrate 101 having a surface 101a for mounting a group E of components, and a molded body 5 formed from a molding resin integrally on the substrate 101. The group E of components includes a light emitting element 2, a light receiving element 3 and an IC chip 4. As shown in FIG. 19, the light emitting element 2, the light receiving element 3 and the IC chip 4 are respectively covered with protective members 6 within the molded body 5.

The light emitting element 2, which is an infrared emitting diode capable of emitting infrared light, has a rectangular configuration provided by cutting a semiconductor wafer including a light emitting layer. The light emitting element 2 is provided, at the bottom surface thereof, with a full electrode formed of gold, and is mounted on the substrate 101 with the full electrode oriented downward. The light emitting element 2 is formed, on the upper surface opposite to the full electrode, with a partial electrode formed of gold. Of the light emitted from the light emitting layer, the light emitted upward through the upper surface of the light emitting element 2 is mainly utilized to provide signals for data communication. In this prior art module, the light receiving element 3 is formed of a PIN photo diode capable of detecting infrared light and has an upper surface formed with a plurality of electrodes. The IC chip 4 controls the infrared emission and reception of the light emitting element 2 and the light receiving element 3, respectively and has an upper surface formed with a plurality of electrodes.

As shown in FIG. 18, the substrate 101 is formed of an insulating material such as a glass fiber-reinforced epoxy resin and generally rectangular as viewed in plan. One of the longitudinal edges of the substrate 1 is formed with a plurality of inwardly convex semi-cylindrical terminals 19. The surface 101a of the substrate 101 is provided with a predetermined wiring pattern P or the like which is electrically connected to the terminals 19 and formed by etching a conductive film.

After the mounting onto the surface 101a of the substrate 101 at predetermined positions, the group E of components, particularly the light receiving element 3 and the IC chip 4, are electrically connected, via gold wires W, to wire-bonding pads 7 forming part of the wiring pattern P by first bonding and second bonding. Specifically, in the first bonding, a gold wire is introduced into a jig called capillary so that the tip end of the wire projects outward from the tip end of the capillary, and the tip end of the wire is melted by heating with hydrogen flame to form a gold ball. Then, by moving the capillary, the gold ball is pressed onto the electrode of the light receiving element 3 (or the IC chip 4) for fixation thereto, thereby completing the first bonding. In the second bonding, the gold wire is extended out of the capillary and guided toward the wire bonding pad 7 with the tip end of the gold wire, i.e. the gold ball fixed. The gold wire is then pressed against the upper surface of the wire bonding pad 7 utilizing the tip end of the capillary while applying ultrasonic vibrations thereto, thereby second-bonding the wire. When the gold wire is fixed under pressure onto the wire bonding pad 7, the gold wire is pressed and cut while slidably moving the capillary. Thus, the wire bonding step is completed. The wire bonding pads 7 are formed by plating part of the wiring pattern P (conductive film) with gold to provide good conduction with the gold wires W. In this way, each of the light receiving element 2 and the IC chip 4 is connected to the corresponding terminals 19.

The connection between the light emitting element 2 and the IC chip 4 (and between the light receiving element 3 and the IC chip 4) is carried out by wire bonding. However, when these elements are directly connected to each other, either the light emitting element (light receiving element 3) or the IC chip 4 is pressed by the capillary in the wire bonding and may be therefore broken. Moreover, since each of the electrodes of the light emitting element 2 (light receiving element 3) and the IC chip 4 is extremely small, it may not be possible to fix a gold wire to the electrode with a large contact area in the second bonding, which may lead to the deterioration of the data communication performance of the infrared data communication module 100. Therefore, as shown in FIG. 18, for preventing the breakage of the elements and the deterioration of the data communication performance, the connection between the light emitting element 2 and the IC chip 4 and between the light receiving element 3 and the IC chip 4 is carried out via jumper pads 11a, 11b of a relatively large surface area formed on the surface 101a of the substrate 101 instead of directly connecting these elements. Specifically, the light emitting element 2 is connected to the jumper pad 11a by wire bonding, whereas the IC chip 4 is connected to the jumper pads 11a and 11b by wire bonding.

Similarly to the die bonding pad, the jumper pads 11a, 11b are formed by plating a conductive film with gold to provide a good conductivity with the gold wires. Specifically, the jumper pad 11a (jumper pad 11b) is obtained by forming a plating conductive pattern 112a (plating conducive pattern 112b) from a conductive film on the surface 101a of the substrate 101 followed by applying a gold foil to the conductive pattern 112a at the region to become the jumper pad 11a (jumper pad 11b) by flowing a current through the plating conductive pattern 112a (plating conductive pattern 112b). The plating conductive patterns 112a, 112b are formed at the same time as forming the wiring pattern P.

As shown in FIG. 18, the connection between the light emitting element 2 and the terminal 19 is performed by bonding the light emitting element 2 onto the die bonding pad 113 electrically connected to the terminal 19. The die bonding pad 113 is formed by plating a conductive film with gold to provide a good conductivity with the full electrode formed on the bottom surface of the light emitting element 2. Specifically, the die bonding pad 113 is obtained by forming an LED conductive pattern 114 from a conductive film on the surface 101a of the substrate 101 followed by applying a gold foil to part of the LED conductive pattern 114 by electroplating by flowing a current through the LED conductive pattern 114. Similarly to the plating conductive pattern 112, the LED conductive pattern 114 is formed at the same time as forming the wiring pattern P. The die bonding pad 113 is so formed to have a minimum size required for bonding the light emitting element 2. Specifically, the die bonding pad 113 is rectangular in plan view and has an area slightly larger than the bottom surface area of the light emitting element 2.

As shown in FIGS. 17 and 19, the molded body 5 seals the above-described group E of components from above the protective members 6 while covering the entirety of the surface 1a of the substrate 1. The molded body 5 is formed of a molding resin which blocks visible light while passing infrared light. The molded body 5 is integrally formed with the light emitting lens 51 in facing relationship to the light emitting element 2 for converging the light emitted through the upper surface of the light emitting element 2 for emission. Further, the molded body 5 is integrally formed with a light receiving lens 52 in facing relationship to the light receiving element 3.

The protective members 6 function to alleviate the stress caused by the molding resin in forming the molded body 5 to prevent these elements from breaking due to such stress. Before the formation of the molded body 5, the protective members 6 are formed by applying a thermosetting resin such as a silicone resin in a gel state to each of the elements 2, 3, 4 and then hardening the resin.

As shown in FIG. 17, the outer surfaces of the module A provided in the above-described manner may be partially covered with a shield case 9 formed of a metal (while exposing the light emitting lens 51, the light receiving lens 52 and the terminals 19) for preventing external electromagnetic noises and infrared light from adversely affecting the IC chip 4. The shield case 9 is provided, at a surface for contacting the molded body 5, with a riser portion 91 which inwardly slants toward the molded body 5 and a fitting portion 93 for fitting into a recess 92 formed on a surface of the molded body 5. Since the riser portion 91 and the fitting portion 93 prevent the detachment of the shield case 9 from the module 100, the shield case 100 can be fixed to the module 100 without the use of an adhesive.

For enhancing the manufacturing efficiency, the module 100 is formed from a material board 110 which includes a plurality of areas for substrates 101 arranged in rows and columns, as shown in FIG. 20. Specifically, a multiplicity of modules 100 are obtained by mounting groups E of elements on the material board 110, forming protective members 6 and molded bodies 5 successively from above, and dividing the board into each of the substrates 101. Specifically, the molded bodies 5 are formed by molding a resin into intermediate sealing bodies 5a each of which is larger, in plan view, than the predetermined size of a molded body 5 and then removing unnecessary portions of each intermediate sealing body 5a in dividing the material board into each of the substrates 101. Thus, the molded body 5 is integrally formed on the substrate 101.

However, the prior art module 100 has the following drawbacks due to the above-described structure.

In the case where modules 100 are formed from a material board 110, the plating conductive patterns 112a, 112b of one substrate 101 need be electrically connected to those of other substrates 101 so that electroplating can be carried out collectively with respect to the plural substrates 101 of the material board 110. For this purpose, as shown in FIG. 18, the plating conductive patterns 112a, 112b of each substrate 101 include respective connecting portions 112a', 112b' extending outward from the edges of the substrate 101. The connecting portions 112a', 112b' are cut in dividing the material board 110 into each of the substrates. As a result, in the case of the connecting portion 112b', for example, its end surfaces 112b" are exposed at the side surface of the module 100, as shown in FIG. 19. Similarly, the end surfaces of the connecting portion 112a' are exposed at the side surface of the module 100. Therefore, when a shield case 9 is attached to the module 100, the end surfaces of the connecting portions 112a', 112b' may contact the shield case 9. As a result, the jumper pads 11a and 11b may be electrically connected to each other via the shield case 9, causing a problem of short-circuiting of the module 100.

Moreover, in the prior art module 100, although light is emitted radially from the light emitting layer in the light emitting element 2, the light emitted through the upper surface of the light emitting element 2 is mainly utilized while wasting the light emitted through the side surfaces of the light emitting element 2. Therefore, the light emitted from the light emitting element 2 is not utilized efficiently.

Further, when an excessive amount of thermosetting resin in a gel state is applied in forming the protective members 6, the thermosetting resin may spread around each of the elements 2, 3 and 4 on the surface 101a of the substrate 101. As a result, in forming the molded body 5, a sufficient contact area may not be provided between the substrate 101 and the molded body 5, which deteriorates the bonding strength between the substrate 101 and the molded body 5. Thus, the two members may be released from each other at the interface, which may result in breakage of the gold wires W or removal of the group E of components.

DISCLOSURE OF THE INVENTION

The present invention is conceived under the circumstances described above. It is, therefore, an object of the present invention to provide an infrared data communication module which is capable of preventing short-circuiting.

Another object of the present invention is to provide an infrared data communication module capable of efficiently utilizing the light emitted from the light emitting element.

Still another object of the present invention is to provide an infrared data communication module capable of enhancing the bond between the substrate and the molded body.

According to a first aspect of the present invention, there is provided an infrared data communication module comprising a substrate having a surface for mounting a group of components which includes a light emitting element, a light receiving element and an IC element, and a molded body formed of a molding resin to entirely cover said surface of the substrate for sealing the group of components. The surface of the substrate is formed with one or a plurality of jumper pads formed by plating a conductive film with gold. Each jumper pad is partially or entirely spaced from an edge of the substrate.

Preferably, outer surfaces of the module are partially covered with a shield case formed of a metal.

Preferably, the shield case is provided, at a surface for contacting the molded body, with either one or both of a riser portion which inwardly slants toward the molded body and a fitting portion for fitting into a recess formed on a surface of the molded body.

According to a second aspect of the present invention, there is provided an infrared data communication module comprising a substrate having a surface provided with a die bonding pad formed by plating a conductive film with gold, and a light emitting element mounted on the die bonding pad. The die bonding pad is generally circular as viewed in plan and has an area larger than a bottom surface area of the light emitting element.

According to a third aspect of the present invention, there is provided an infrared data communication module comprising a substrate having a surface for mounting a light emitting element, a light receiving element and an IC element, a protective member for covering each of the elements, and a molded body formed of a molding resin on said surface of the substrate to cover the protective member. The surface of the substrate is formed with a recess for enhancing bond between the substrate and the molded body.

Preferably, the recess is formed on said surface of the substrate at each of plural portions which avoid the protective member.

Preferably, the recess is generally cylindrical.

According to a fourth aspect of the present invention, there is provided a method of making infrared data communication modules each of which comprises a substrate having a surface for mounting a group of components which includes a light emitting element, a light receiving element and an IC element, and a molded body formed of a molding resin to entirely cover said surface of the substrate for sealing the group of components. The surface of the substrate is formed with one or a plurality of jumper pads formed by plating a conductive film with gold. The method comprises the steps of forming a conductive film on an entire surface of a material board including substrate areas which later provide substrates, etching the conductive film to form a plating conductive pattern which later provides jumper pads, applying a gold foil on the plating conductive pattern by electroplating at jumper pad regions which correspond to the jumper pads, removing a connecting portion of the plating conductive pattern extending from an edge of each substrate area to outside of the substrate area, mounting groups of elements, shaping a molding rein into molded bodies on the material board, and dividing the material board along each of the substrate areas.

According to a fifth aspect of the present invention, there is provided a method of making an infrared data communication module which comprises a substrate having a surface for mounting a group of components including a light emitting element, a light receiving element and an IC element, and a molded body formed of a molding resin to seal the group of components. The method comprises the steps of forming a recess on said surface of the substrate for enhancing bond between the substrate and the molded body before the group of components is mounted on the substrate, forming the molded body so that the molding resin is trapped and hardened in the recess after the group of components is mounted on the substrate.

Other features and advantages of the present invention will become clearer from the detailed description given below with reference to the accompanying drawings.

BEST MODE FOR CARRYING OUT THE INVENTION

Preferred embodiments of the present invention will be described below in detail with reference to the accompanying drawings.

Figure 1:
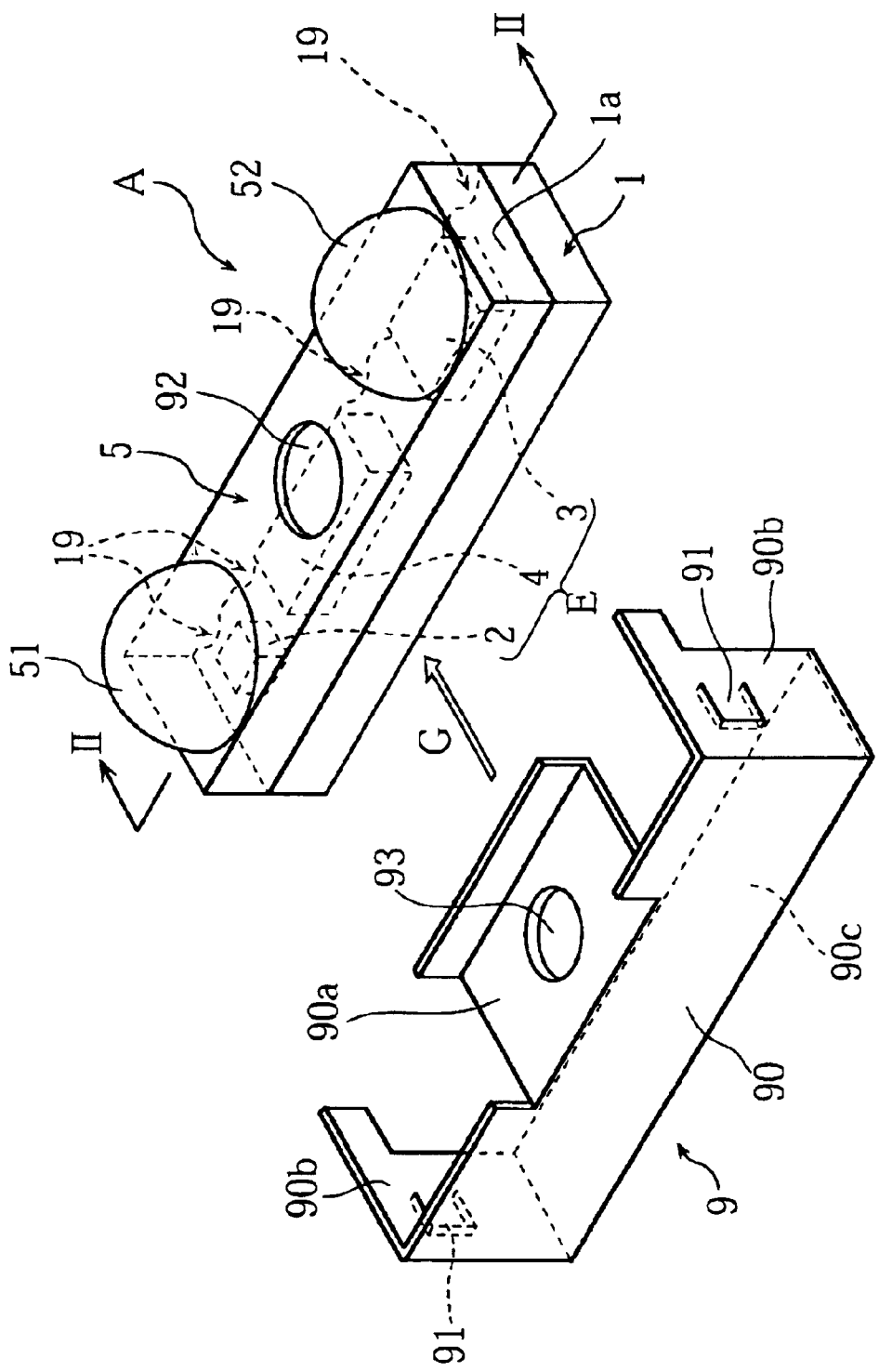
FIG. 1 is a schematic perspective view showing an infrared data communication module according to the present invention.
Figure 2:
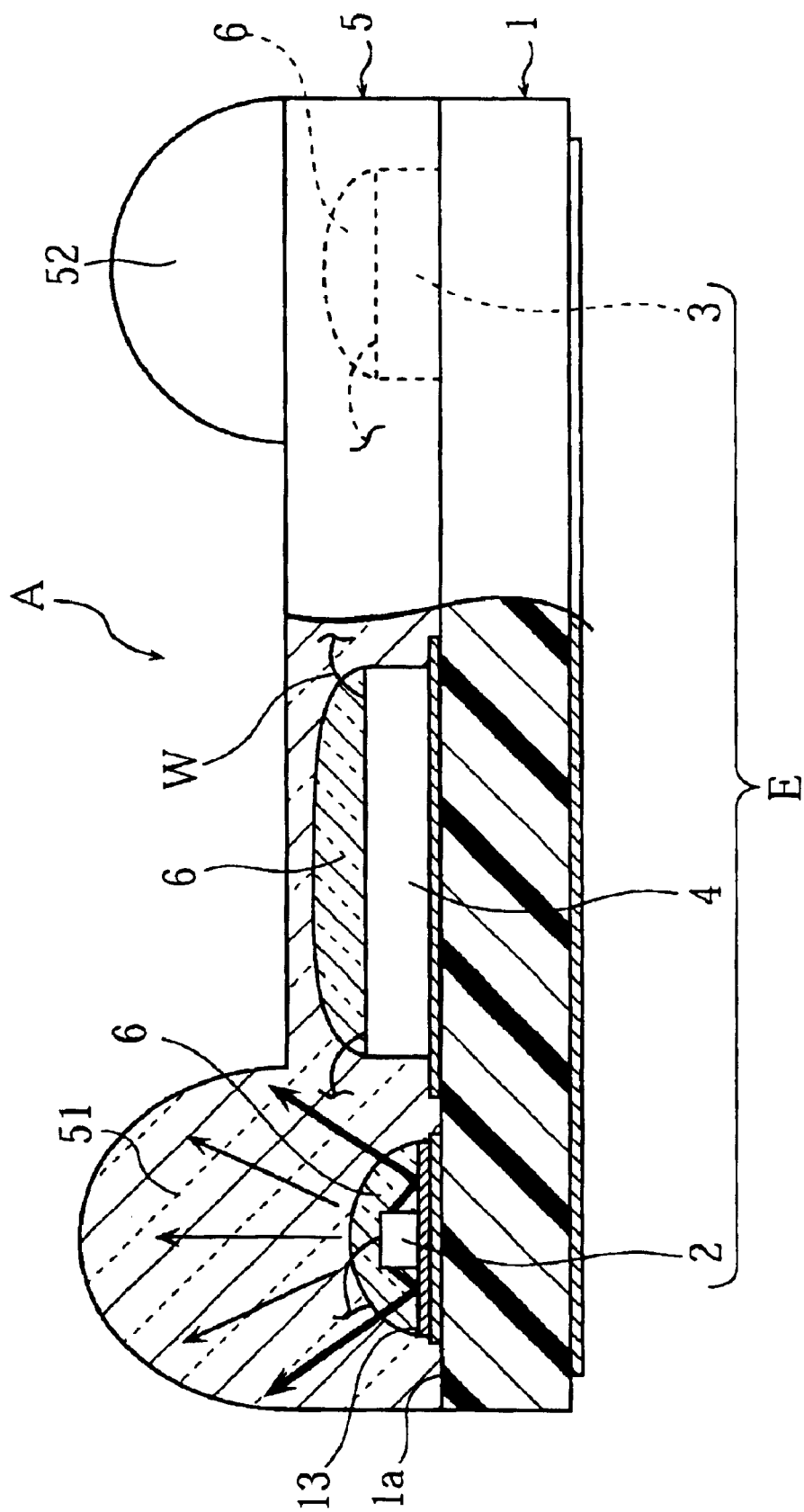
FIG. 2 is a sectional view taken along lines II—II of FIG. 1.

FIGS. 1–4 illustrate an infrared data communication module according to the present invention. FIGS. 5–16 illustrate a method of making an infrared data communication module according to the present invention. As shown in FIGS. 1 and 2, the infrared data communication module A (hereinafter, simply refereed to as "module") comprises a substrate 1 having a surface 1a on which a group E of components is mounted, protective members 6 for covering the elements 2, 3 and 4, respectively, and a molded body 5 integrally formed on the substrate 1 to cover the protective members 6. The group E of components includes a light emitting element 2, a light receiving element 3 and an IC chip 4.

As shown in FIG. 1, the light emitting element 2, which may be e.g. an infrared emitting diode capable of emitting infrared light, has a rectangular configuration provided by cutting a semiconductor wafer including a light emitting layer. The light emitting element 2 is provided, at the bottom surface thereof, with a full electrode formed of gold, and is mounted on the substrate 1 with the full electrode oriented downward. The light emitting element 2 is formed, on the upper surface opposite to the full electrode, with a partial electrode formed of gold. The light from the light emitting layer is emitted through the upper surface and the side surfaces of the light emitting element 2.

The light receiving element 3, which may be e.g. a PIN photo diode capable of detecting infrared light, has an upper surface formed with a plurality of electrodes. The IC chip 4 controls the infrared emission and reception of the light emitting element 2 and the light receiving element 3, respectively. Specifically, the IC chip 4 incorporates a modulation-demodulation circuit and a wave shaping circuit. The IC chip 4 has an upper surface formed with a plurality of electrodes.

Figure 3:
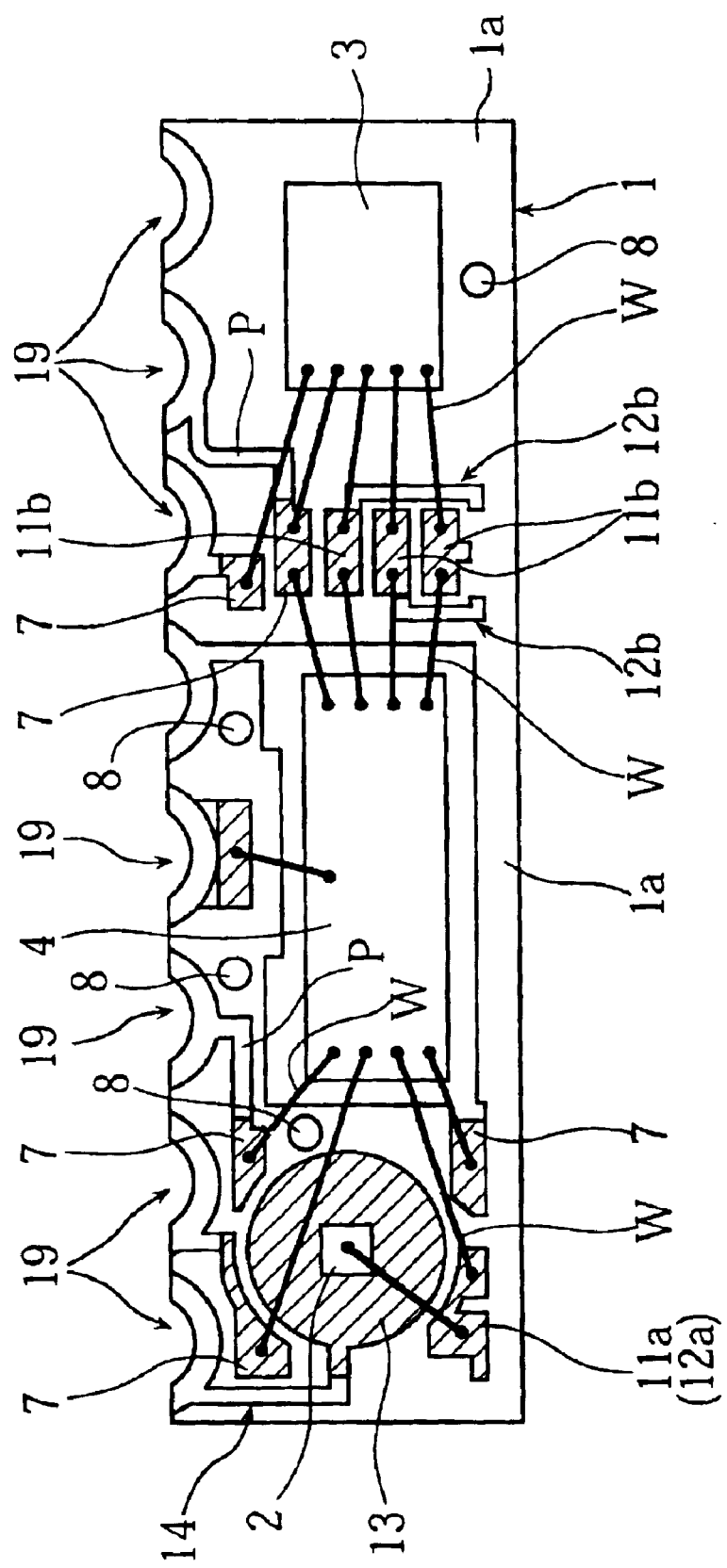
FIG. 3 is a plan view showing the internal structure of the infrared data communication module shown in FIG. 1.

As shown in FIG. 3, the substrate 1 is formed of an insulating material such as a glass fiber-reinforced epoxy resin and generally rectangular as viewed in plan. One of longitudinal edges of the substrate 1 is formed with a plurality of inwardly convex semi-cylindrical terminals 19.

The substrate 1 has one surface 1a formed with wire bonding pads 7, a jumper pad 11a, jumper pads 11b and a die bonding pad 13. The surface 1a of the substrate 1 is formed with recesses 8 for enhancing bonding between the substrate 1 and the molded body 5.

Each of the wire bonding pads 7 is connected, via a wire, to a respective electrode of the light receiving element 3 or the IC chip 4 mounted on the surface 1a of the substrate 1. The wire bonding pad 7 is formed as part of a wiring pattern P which is formed to be electrically connected to the terminals 19 and which will be described later.

The jumper pad 11a serves to electrically connect the light emitting element 2 to the IC chip 4, whereas each of the jumper pads 11b serves to electrically connect the light receiving element 3 to the IC chip 4. The light emitting element 2 is connected to the jumper pad 11a via a wire, so is the light receiving element 3 to each jumper pad 11b and the IC chip 4 to each of the jumper pads 11a and 11b. The jumper pads 11a, 11b are formed as part of plating conductive patterns 12a, 12b, respectively, which will be described later. Preferably, each of the jumper pads 11a, 11b has a larger area than each electrode of the light emitting element 2, the light receiving element 3 and the IC chip 4.

The die bonding pad 13 is utilized for bonding the light emitting element 2 to the surface 1a of the substrate 1. The die bonding pad 13 forms part of an LED conductive pattern 14 which is formed to be electrically connected to the terminals 19 and which will be described later. The die bonding pad 13 is generally circular and has an area which is larger than the bottom surface area of the light emitting element 2. The area of the die bonding pad 13 is set to reflect the light emitted through the side surfaces of the light emitting element 2 toward a light emitting lens 51 which will be described later.

Figure 4:
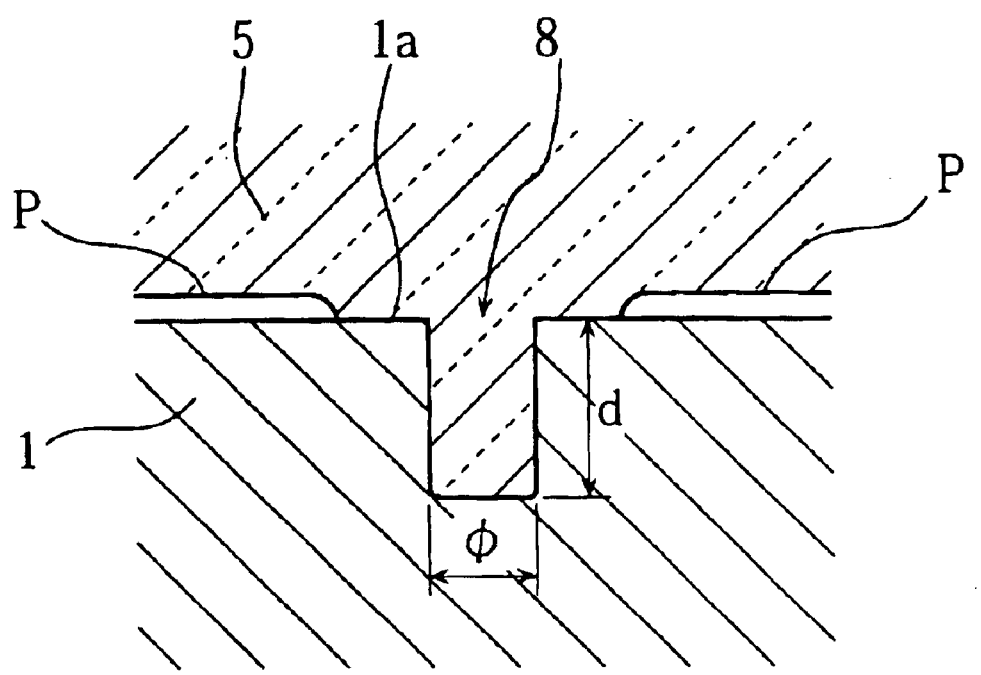
FIG. 4 is a sectional view illustrating a recess formed on the substrate.

As shown in FIGS. 3 and 4, the recesses 8 are formed to receive a molding resin for forming the molded body 5 but not to receive the resin material for forming the protective members 6. The recesses are formed on the surface 1a of the substrate 1 at portions where the protective members 6 are not to be formed, i.e. at portions where the resin material does not spread in forming the protective members 6. Although four recesses 8 are provided in the embodiment shown in FIG. 3, a larger number of recesses provide a greater advantage.

Each of the recesses 8 is generally cylindrical and is about 0.2 mm in inner diameter Φ and 0.2–0.5 mm in depth d for example. As compared with a polygonal recess for example, the circular recess 8 is advantageous in that the molding resin can be loaded in the recess without leaving any clearances in forming the molded body 5.

The protective members 6 are formed of a resin material such as a silicone resin for example. Specifically, a transparent thermosetting resin which is in a gel state at room temperature is applied to cover the light emitting element 2, the light receiving element 3 and the IC chip 4, and is then heated to a predetermined temperature for hardening. The protective members 6 thus formed are elastomeric to alleviate the stress caused by the molding resin as the molded body 5.

As shown in FIGS. 1 and 2, the molded body 5, which is formed as one-piece, seals the above-described group E of components from above the protective members 6 while covering the entirety of the surface 1a of the substrate 1. The molded body 5 is formed, by transfer molding for example, of a material which blocks visible light while passing infrared light. The light emitting lens 51 is provided in the molded body 5 in facing relationship to the light emitting element 2 for converging the light emitted through the upper surface of the light emitting element 2 for emission. Further, the molded body 5 is formed, at a portion facing the light receiving element 3, with a light receiving lens 52 for collecting and guiding the light traveling toward the module A into the light receiving element 3. The lenses 51, 52 are arranged to provide optical axes which coincide with the optical axes provided by the light emitting element 2 and the light receiving element 3, respectively. The upper surface of the molded body 5 is formed, between the light emitting lens 51 and the light receiving lens 52, with a circular recess 92 for fixing a shield case 9, which will be described later.

As shown in FIG. 1, the outer surfaces of the module A are partially covered with the shield case 9 formed of a metal for preventing external electromagnetic noises and infrared light from adversely affecting the IC chip 4. The shield case 9 comprises, a first bent portion 90a covering the upper surface of the module A between the light emitting lens 51 and the light receiving lens 52, a pair of second bent portions 90b covering the longitudinally opposite end surfaces of the module A, a third bent portion 90c covering the bottom surface of the module A while exposing the terminals 19, all of which extends from a flat vertical wall 90. Thus, the shield case 9 covers the outer surfaces of the module A while exposing the light emitting lens 51, the light receiving lens 52 and the terminals 19.

The first bent portion 90a is formed with a fitting portion 93 for fitting into the recess 92 of the molded body 5. Each of the second bent portions 90b is formed with a riser portion 91 which inwardly slants toward the molded body 5. When the shield case 9 is fitted over the module A in the arrow G direction for mounting, the two riser portions 91 are pressed against the longitudinally opposite end surfaces of the module A with an elastic force while the fitting portion 93 fits into the recess 92 of the molded body 5. Therefore, the detachment of the shield case 9 from the module A can be prevented without the use of an adhesive.

Figure 5:
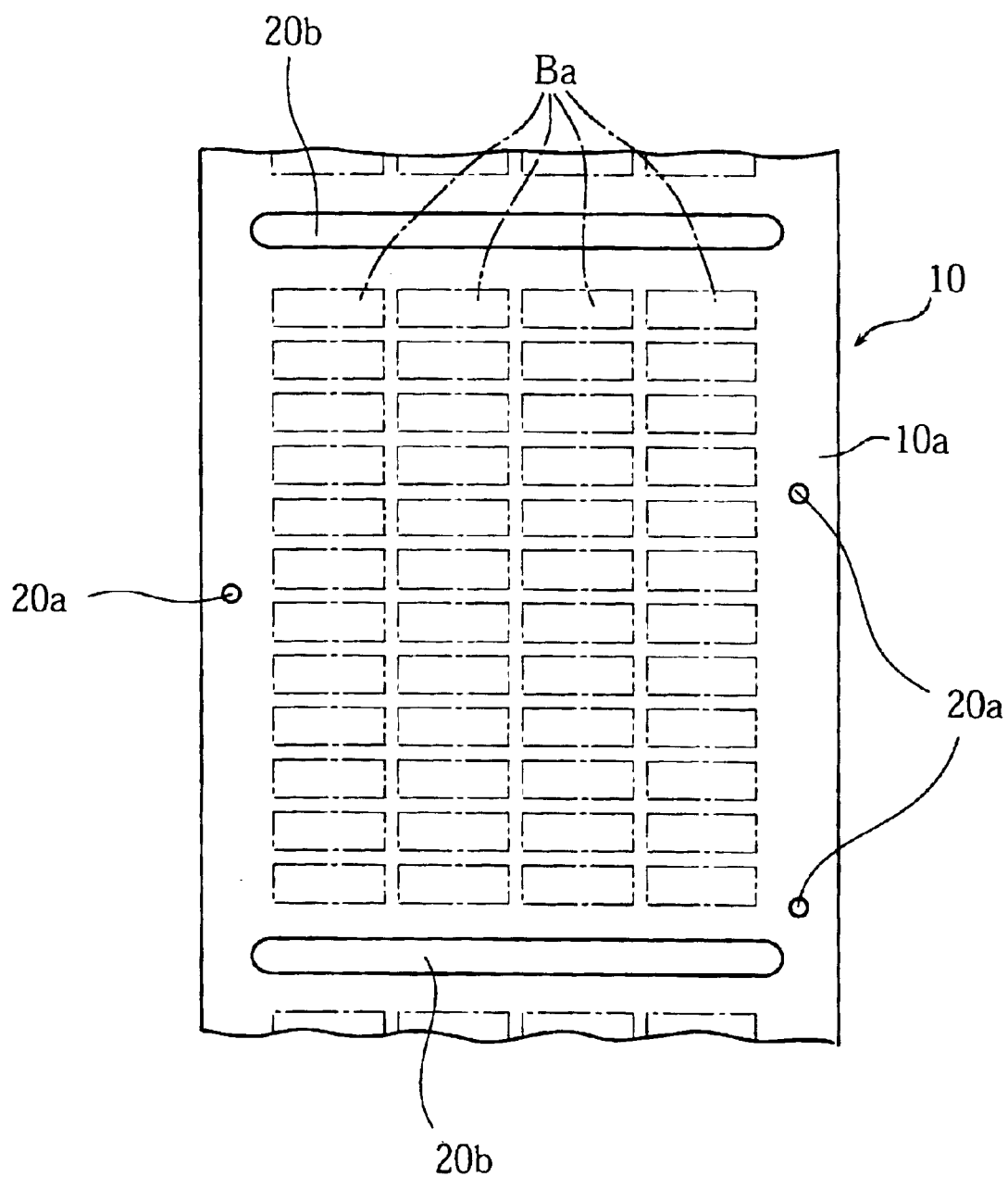
FIG. 5 is a schematic plan view illustrating a method of making an infrared data communication module according to the present invention.

Next, a method of making the module A having the above-described structure will be described. In the method, a material board 10 as shown in FIG. 5 is used which includes a plurality of substrate areas Ba which later become the substrates 1 and which are arranged in rows and columns. The material board 10 may be formed, at opposite sides thereof, with engagement holes 20a for fixing the material board 10 as required in manufacturing the module A. The material board 10 is formed with slits 20 arranged at a predetermined pitch for preventing the warping of the material board 10.

Figure 6:
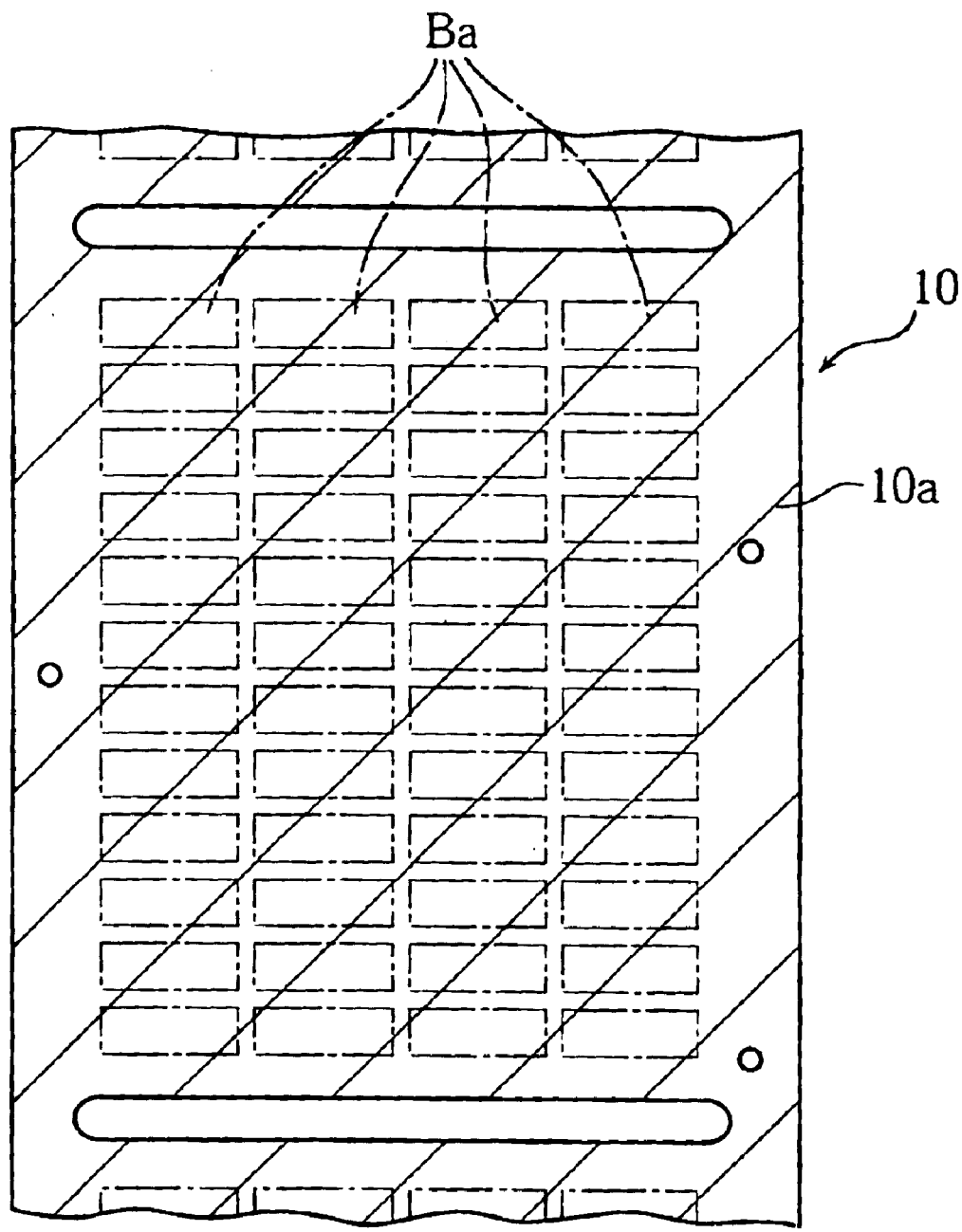
FIG. 6 is a schematic plan view illustrating the method of making an infrared data communication module according to the present invention.

As shown in FIG. 6, for forming the module A, a conductive film is first formed over the entire portion of a surface 10a of the material board 10. The conductive film (hatched portion of FIG. 6) may be formed by plating the surface of the material board 10 to provide a copper foil for example.

Figure 7:
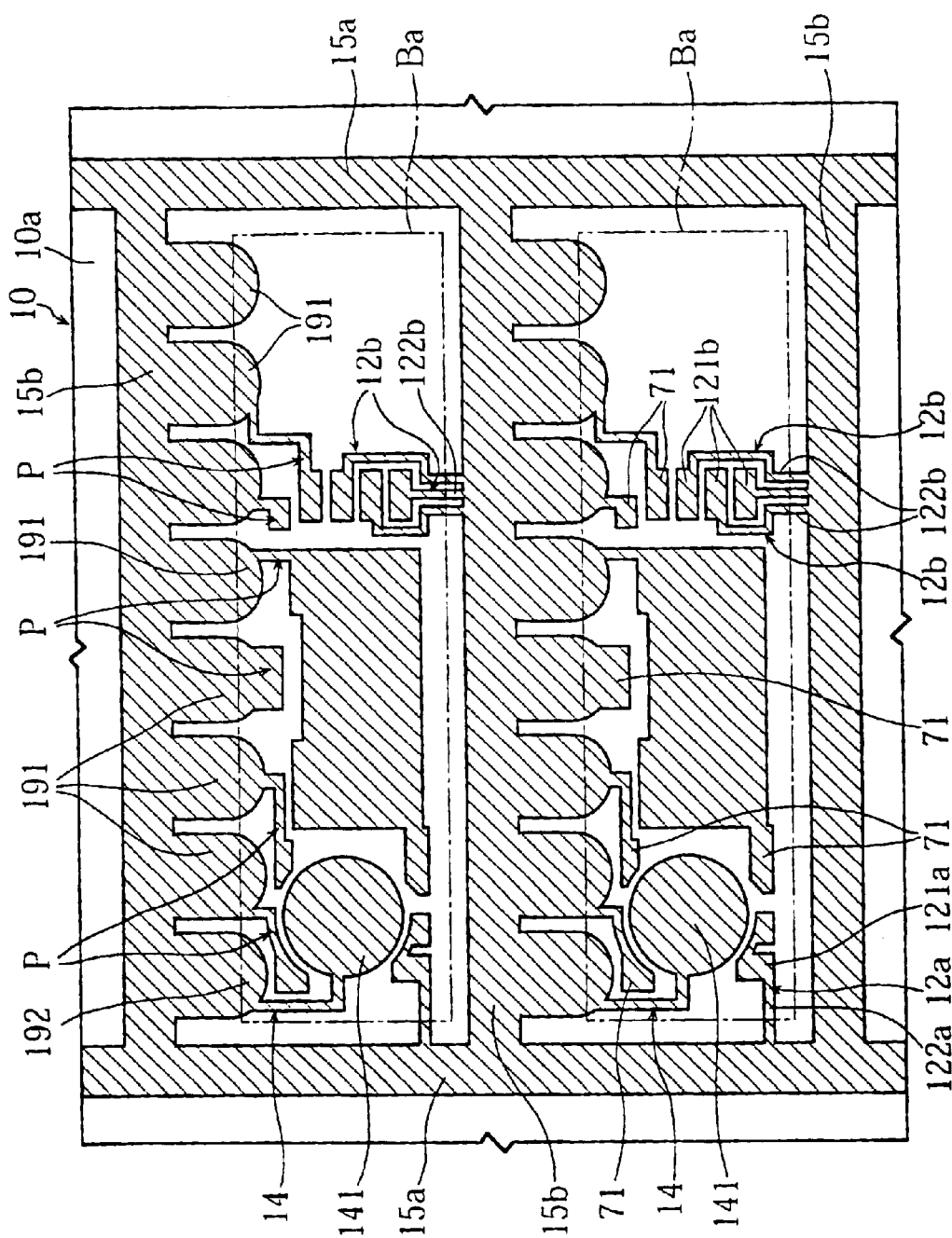
FIG. 7 is a schematic plan view illustrating the method of making an infrared data communication module according to the present invention.

Subsequently, as shown in FIG. 7, the conductive film on the surface 10a of the material board 10 is subjected to etching to provide predetermined unit circuit patterns, a longitudinal common pattern 15a extending from one substrate areas Ba to another longitudinally of the board, and a transverse common pattern 15b extending between the substrate areas Ba widthwise of the board (hatched portions of FIG. 7). Each of the predetermined unit circuit pattern is provided for a respective substrate area Ba, and includes a wiring pattern P for electrically connecting a light receiving element 3 and an IC chip 4 to terminals 19, plating conductive patterns 12a, 12b for providing jumper pads 11a, 11b, respectively, and an LED conductive pattern 14 for electrically connecting the light emitting element to the terminals 19.

The wiring pattern P includes, at end portions thereof, bonding pad regions 71 which later become wire bonding pads 7 by gold-plating the surfaces thereof. The wiring pattern P further includes, at other end portions, terminal regions 191 each of which later becomes the terminal 19 and has an area larger than a through-hole 19a, which will be described later. At one of longitudinally extending edges of the substrate area Ba, each of the terminal regions 191 extends across the boundary of the substrate area Ba for connection to the transverse common pattern 15b.

The plating conductive pattern 12a includes, at one end thereof, a jumper pad region 121a which later becomes a jumper pad 11a by gold-plating the surface thereof. The plating conductive pattern 12a includes, at another end thereof, a connecting portion 122a connected to the longitudinal common pattern 15a at one of widthwise extending edges of the substrate area Ba. Thus, the connecting portion 122a extends across the edge of the substrate area Ba to the outside of the substrate area Ba.

The plating conductive pattern 12b includes, at end portions thereof, jumper pad regions 121b which later become jumper pads 11b by gold-plating the surfaces thereof. The plating conductive pattern 12b further includes, at other ends thereof, connecting portions 122b connected to the transverse common pattern 15b at the other longitudinally extending edge of the substrate area Ba. Thus, the connecting portions 122b extend across the edge of the substrate area Ba to the outside of the substrate area Ba.

The LED conductive pattern 14 includes, at one end thereof, a conducive pad region 141 which later becomes a die bonding pad 13 by gold-plating the surface thereof. The conductive pad region 141 is generally circular and has an area larger than the bottom surface area of the light emitting element 2. The conductive pattern 14 includes, at the other end thereof, a terminal region 192 which later becomes the terminal 19 and has an area larger than a through-hole 19a, which will be described later. The terminal region 192 extends across the boundary of the substrate area Ba for connection to the transverse common pattern 15b.

The longitudinal common pattern 15a and the transverse common pattern 15b functions to connect the above-described circuit patterns to each other. The transverse common pattern 15b is connected, at opposite ends thereof, to the longitudinal common pattern 15a.

The above-described circuit patterns are simultaneously formed with respect to all the substrate areas Ba of the material board 10 by known photolithography. Further, with this method, the longitudinal common pattern 15a and the transverse common pattern 15b can be formed at the same time as forming the circuit patterns. Specifically, a photoresist material is first applied to the surface of the material board 10 formed with the conductive film. The photoresist material is then exposed to light using a mask formed with openings corresponding to the circuit patterns, the longitudinal common pattern 15a and the transverse common pattern 15b. Subsequently, the material board 10 is immersed into a developer liquid for example to remove unnecessary portions of the photoresist material. As a result, the conductive film is covered with the photoresist material only at portions corresponding to the circuit patterns, the longitudinal common pattern 15a and the transverse common pattern 15b. Then, the material board 10 is immersed into e.g. a solution capable of dissolving the conductive film to remove the exposed portions of the conductive film. Thereafter, the photoresist material is removed.

Figure 8:
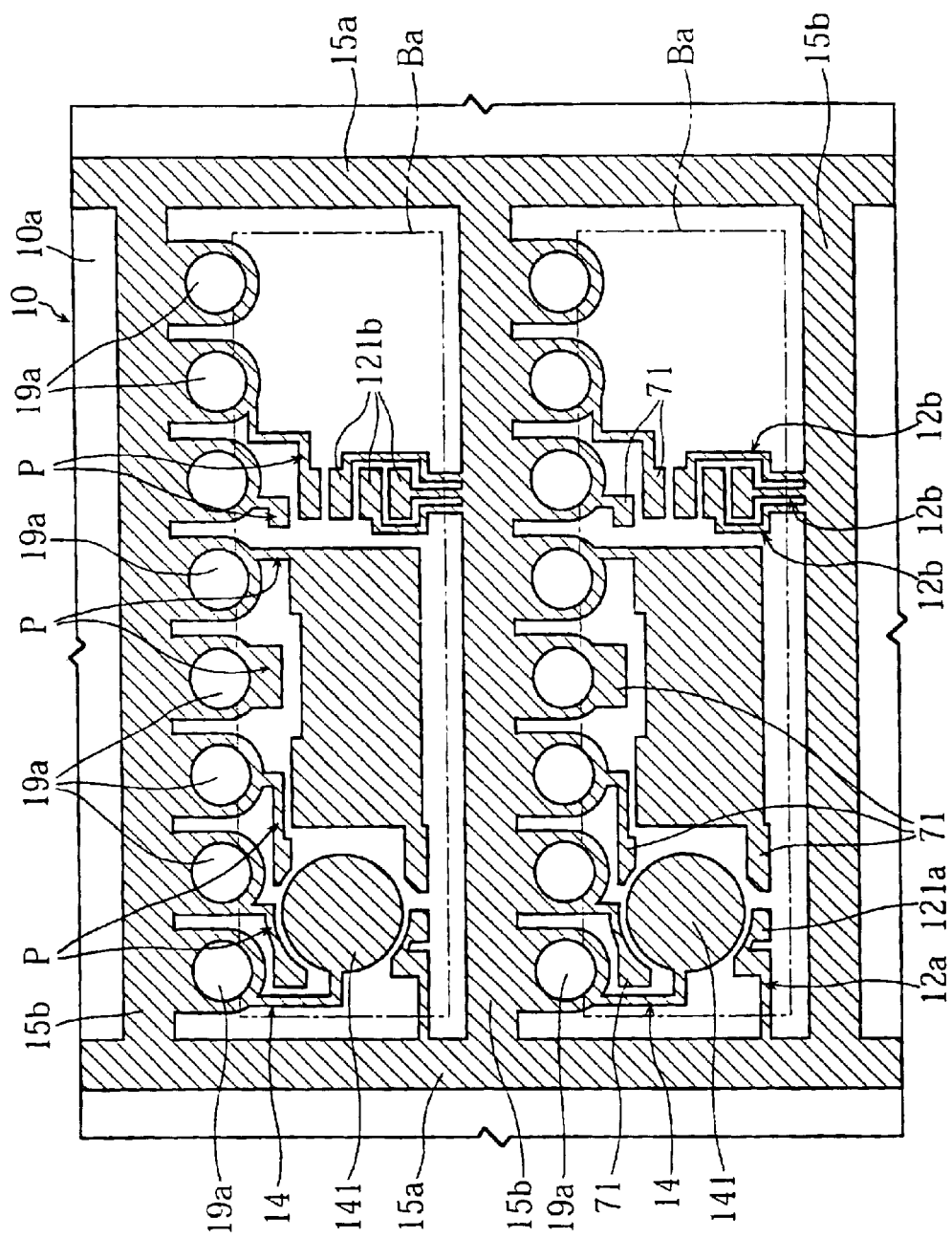
FIG. 8 is a schematic plan view illustrating the method of making an infrared data communication module according to the present invention.

Then, as shown in FIG. 8, through-holes 19a are formed at predetermined portions on each of the substrate areas Ba. The inner circumferential wall of each through-hole 19a is covered with a conductive film to be electrically connected to the terminal region 191 (or terminal region 192). The through-hole 19a penetrates through the material board 10 at the boundary of the substrate area Ba. Part of the through-hole 19a becomes a terminal 19 by later cutting the through-hole.

Figure 10:
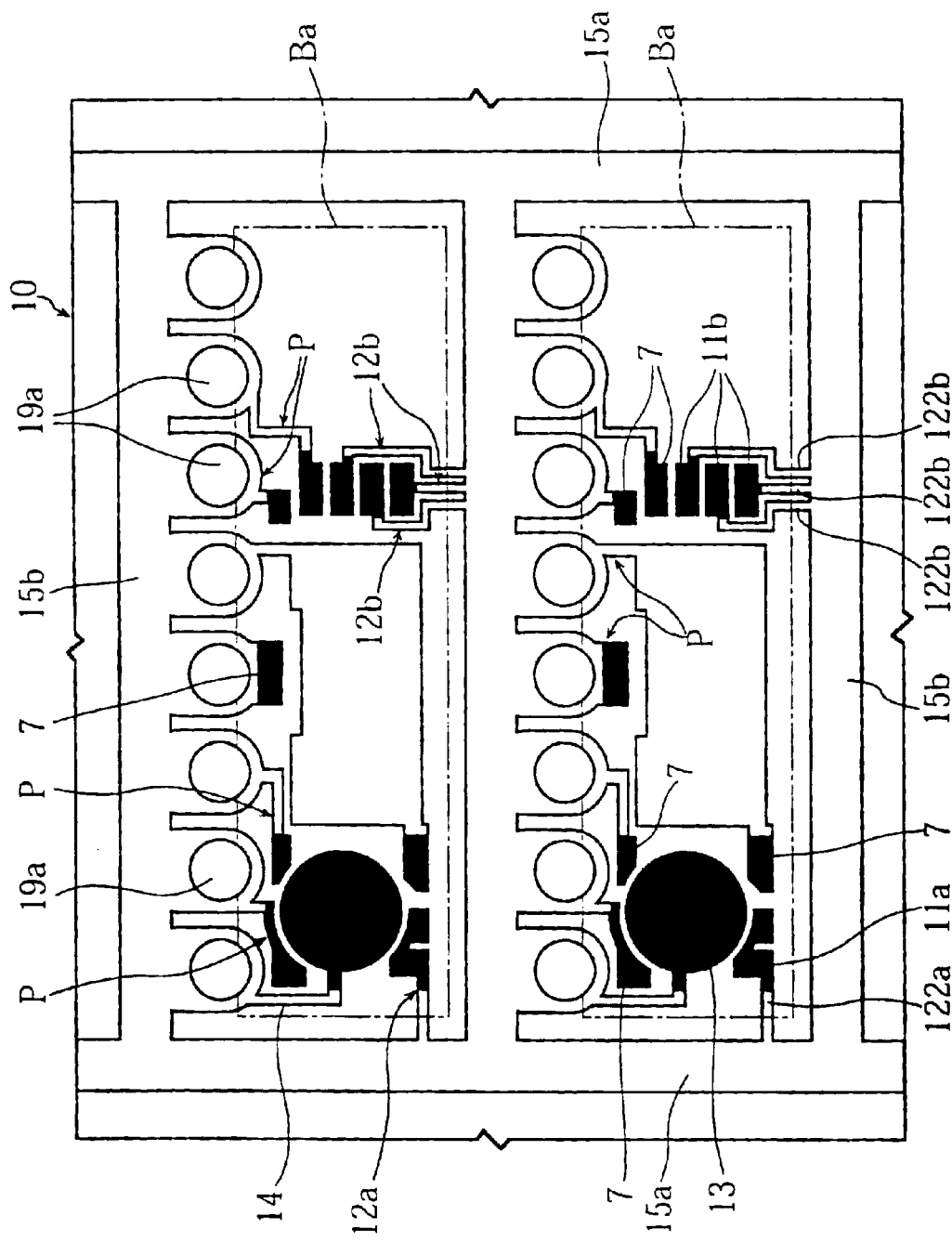
FIG. 10 is a schematic plan view illustrating the method of making an infrared data communication module according to the present invention.

Subsequently, as shown in FIG. 10, a gold foil is applied to predetermined regions (the bonding pad regions 71, the jumper pad regions 121a, 121b and the conductive pad region 141) in the circuit pattern (the wiring pattern P, the plating conductive patterns 12a, 12b and the LED conductive pattern 14) by electroplating (See black portions of FIG. 10).

Figure 9:
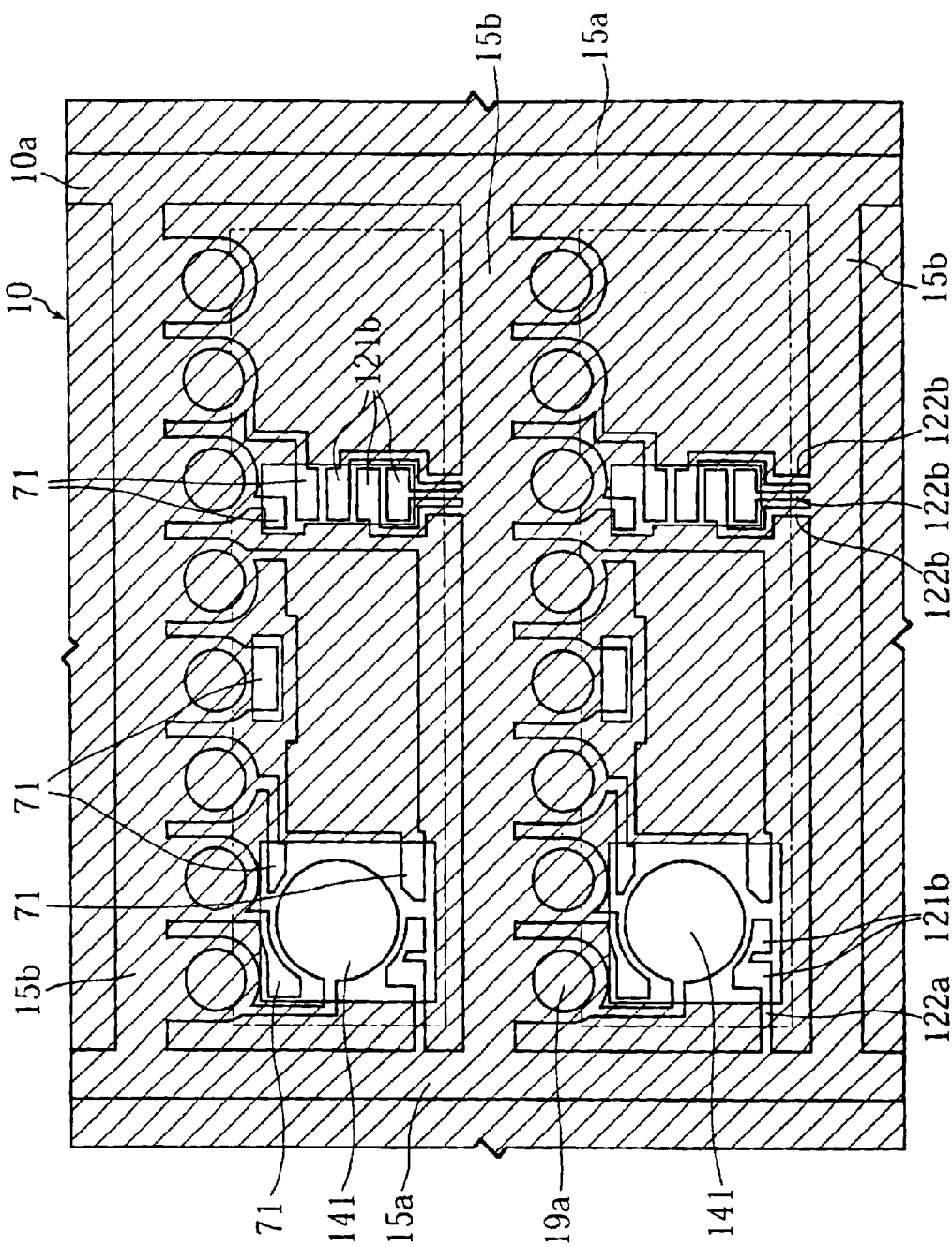
FIG. 9 is a schematic plan view illustrating the method of making an infrared data communication module according to the present invention.

Specifically, as shown in FIG. 9, a resist (hatched portion of FIG. 9) is formed on the surface of the material board 10 while exposing the above-described predetermined regions. At this time, the longitudinal common pattern 15a and the transverse common pattern 15b are also partially exposed to provide contacts for the electroplating. Such a resist is formed by known photolithography. Specifically, a photoresist material is applied to the entire region of the material board 10 on which the predetermined pattern of a conductive film has been formed. The photoresist material is then exposed to light using a mask formed with openings corresponding to the above-described predetermined regions. Subsequently, the material board 10 is immersed into a developer liquid for example to remove unnecessary portions of the photoresist material. Then, the material board 10 is immersed in an electrolyte solution to pass a direct current across the material board 10 formed with the photoresist as the cathode and gold as the anode. At this time, the predetermined regions are exposed to the electrolyte solution, and the circuit patterns are electrically connected to each other via the longitudinal common pattern 15*a* and the transverse common pattern 15*b*. Therefore, as shown in FIG. 10, a gold foil is formed as adhered to all of the predetermined regions. As a result, the bonding pads 7, the jumper pads 11*a*, 11*b* and the die bonding pad 13 are formed together. At this time, the die bonding pad 13 is made generally circular and larger than the bottom surface area of the light emitting element 2. Thereafter, the photoresist material is removed.

Figure 11:
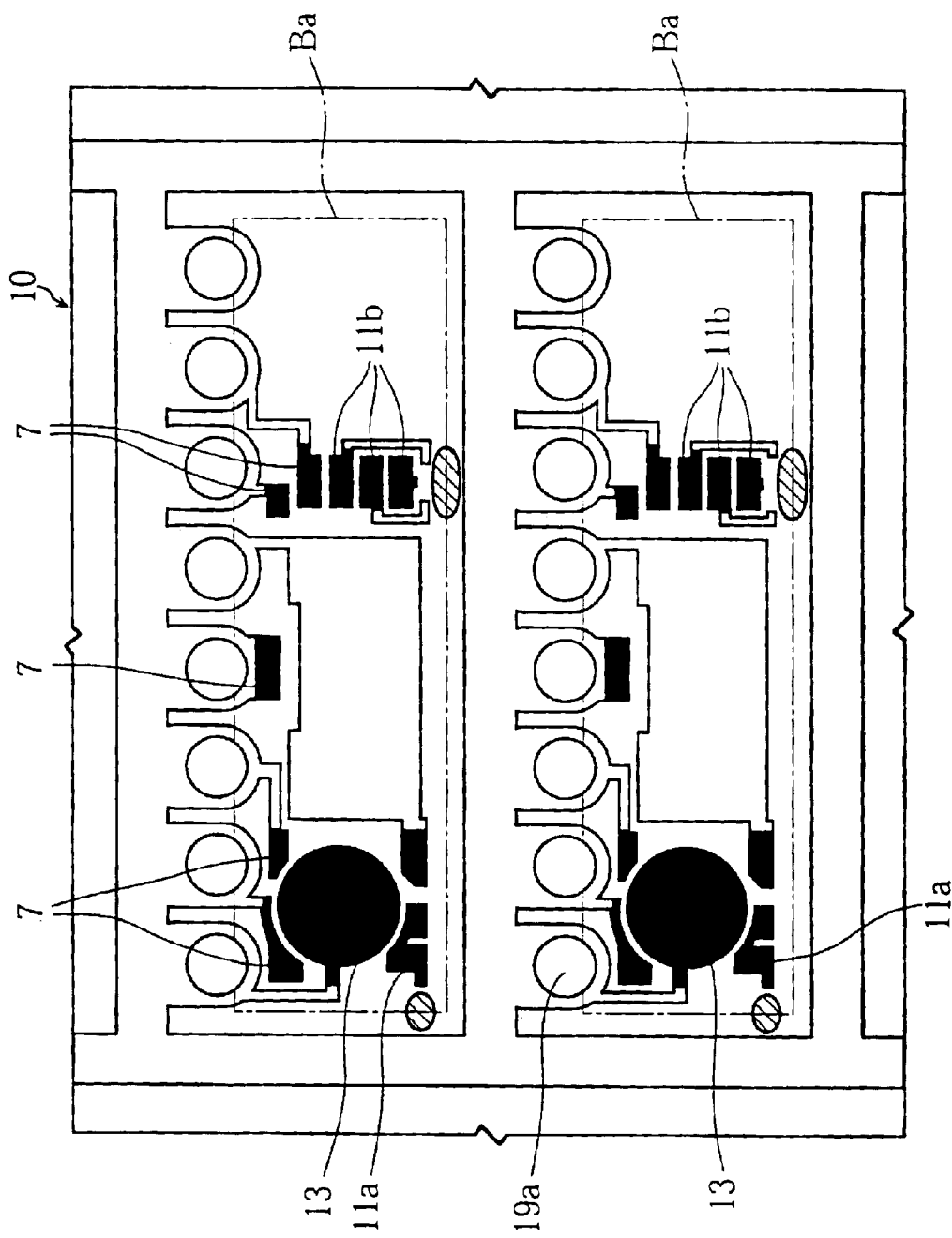
FIG. 11 is a schematic plan view illustrating the method of making an infrared data communication module according to the present invention.

Subsequently, as shown in FIG. 11, the connecting portions 122*a*, 122*b* (See FIG. 10) of the plating conductive patterns 12*a*, 12*b*, respectively, are removed. This process step is performed by known photolithography. Specifically, a photoresist material is applied to the entire surface of the material board 10 formed with the bonding pads 7, the jumper pads 11*a*, 11*b* and the die bonding pad 13. The photoresist material is then exposed to light using a mask formed with openings at locations corresponding to the connecting portions 122*a*, 122*b* (hatched portions of FIG. 11). Subsequently, the material board 10 is immersed into a developer liquid for example to dissolve the photoresist material at the connecting portions 122*a*, 122*b*. Then, the material board 10 is immersed into a solution capable of dissolving the conductive film to dissolve the connecting portions 122*a*, 122*b* followed by removing the photoresist material. As a result, the jumper pads 11*a*, 11*b* are separated from the boundary of the substrate area Ba.

Then, though not illustrated, an insulating film is formed on the surface 10*a* of the material board 10 while exposing the bonding pads 7, the jumper pads 11*a*, 11*b*, the die bonding pad 13 and the inner circumferential surfaces of the through-holes 19*a*. This may be performed by applying a photosensitive material called green resist to the entire surface 10*a* of the material board 10, exposing the photosensitive material to light using a mask having openings corresponding to the bonding pads 7, the jumper pads 11*a*, 11*b*, the die bonding pad 13 and the through-holes 19*a*, and immersing the material board 10 into a developer liquid for example to remove the unnecessary portions of the photosensitive material.

Figure 12:
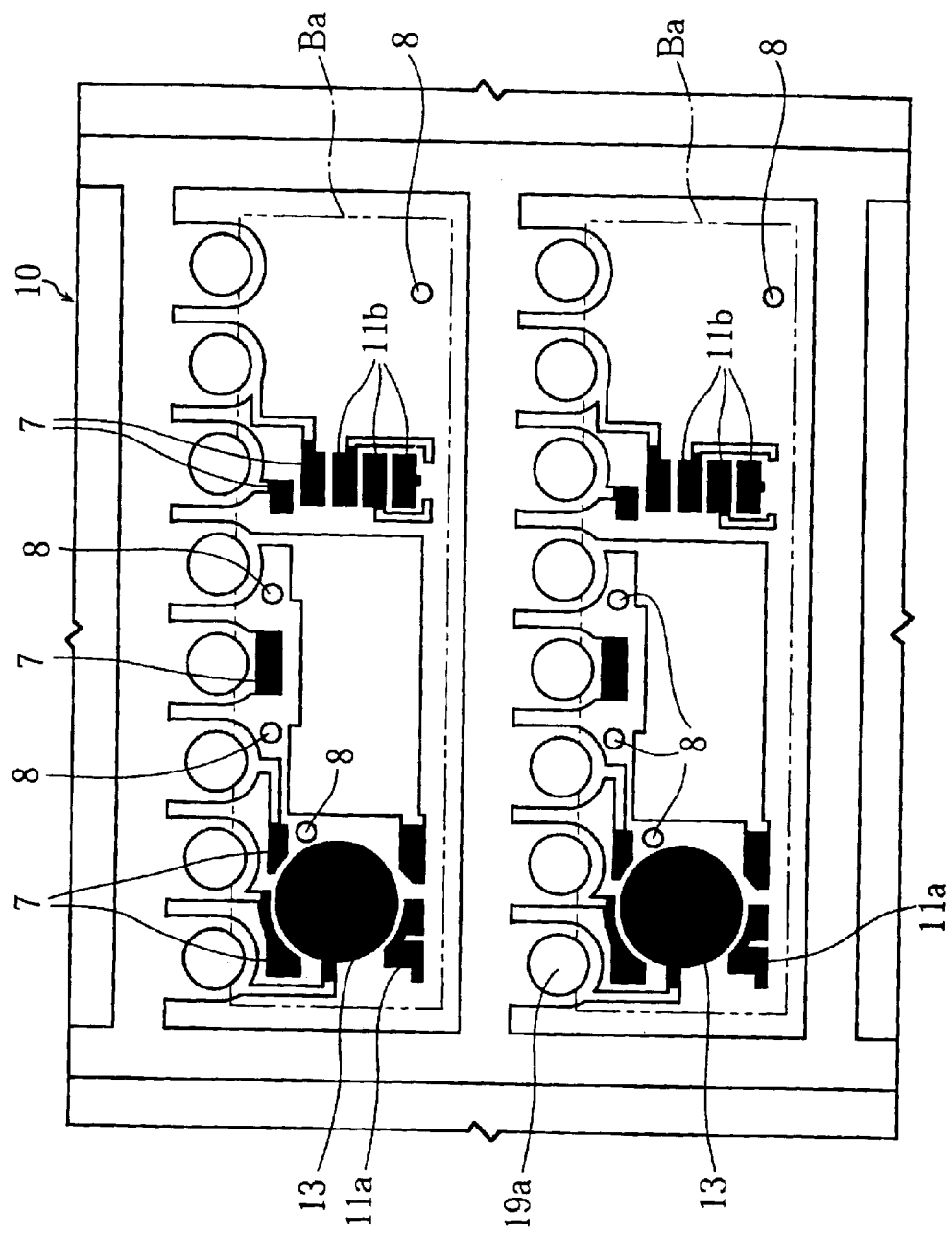
FIG. 12 is a schematic plan view illustrating the method of making an infrared data communication module according to the present invention.

Subsequently, as shown in FIG. 12, recesses 8 are formed at predetermined locations in each of the substrate areas Ba on the surface 10*a* of the material board 10. Each of the recesses 8 may be formed by a drill having a tip end whose outer diameter is smaller than about 0.2 mm. In forming the recess 8, the drill is moved generally perpendicularly to the material board 10 into and out of the material board.

Figure 13:
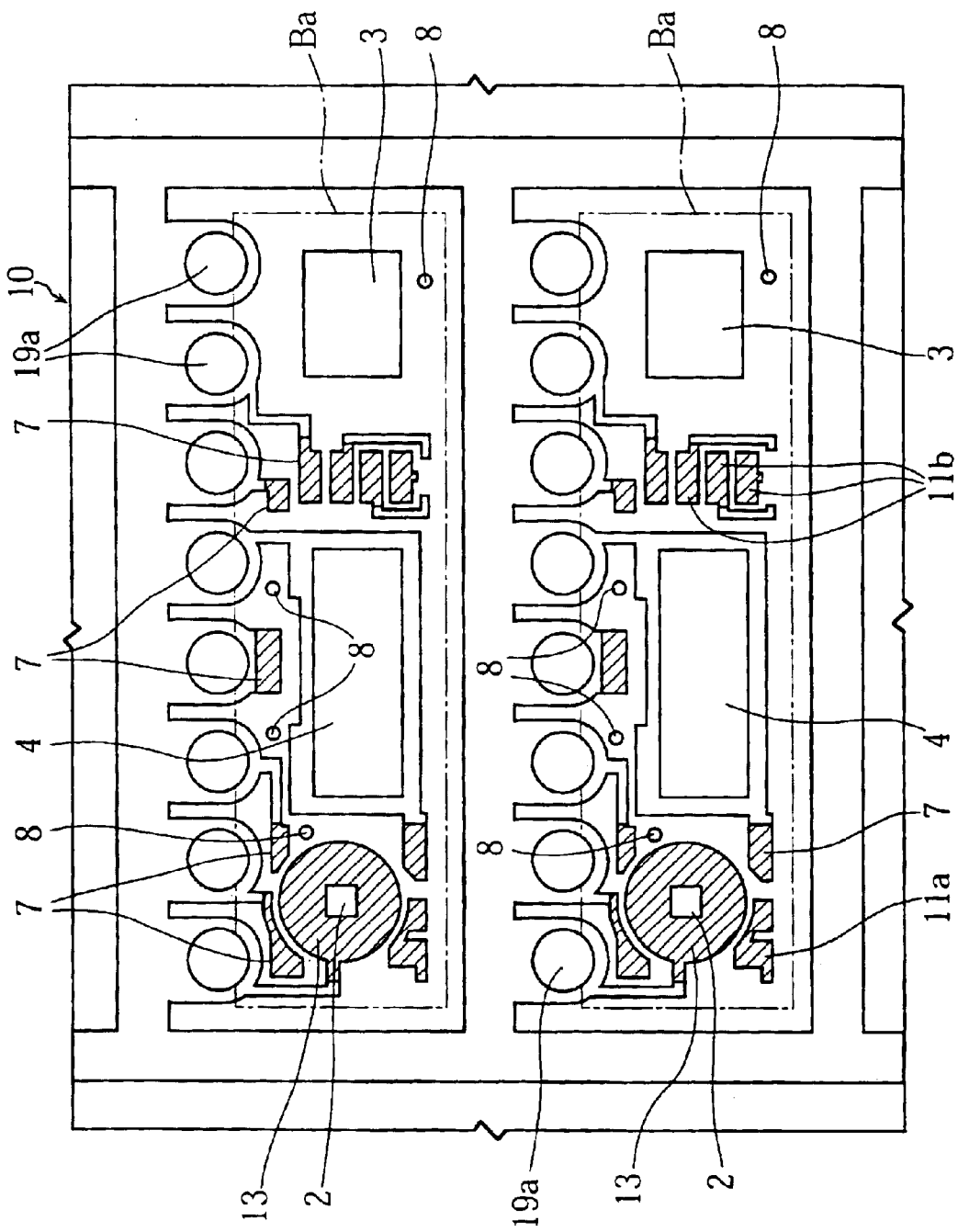
FIG. 13 is a schematic plan view illustrating the method of making an infrared data communication module according to the present invention.
Figure 14:
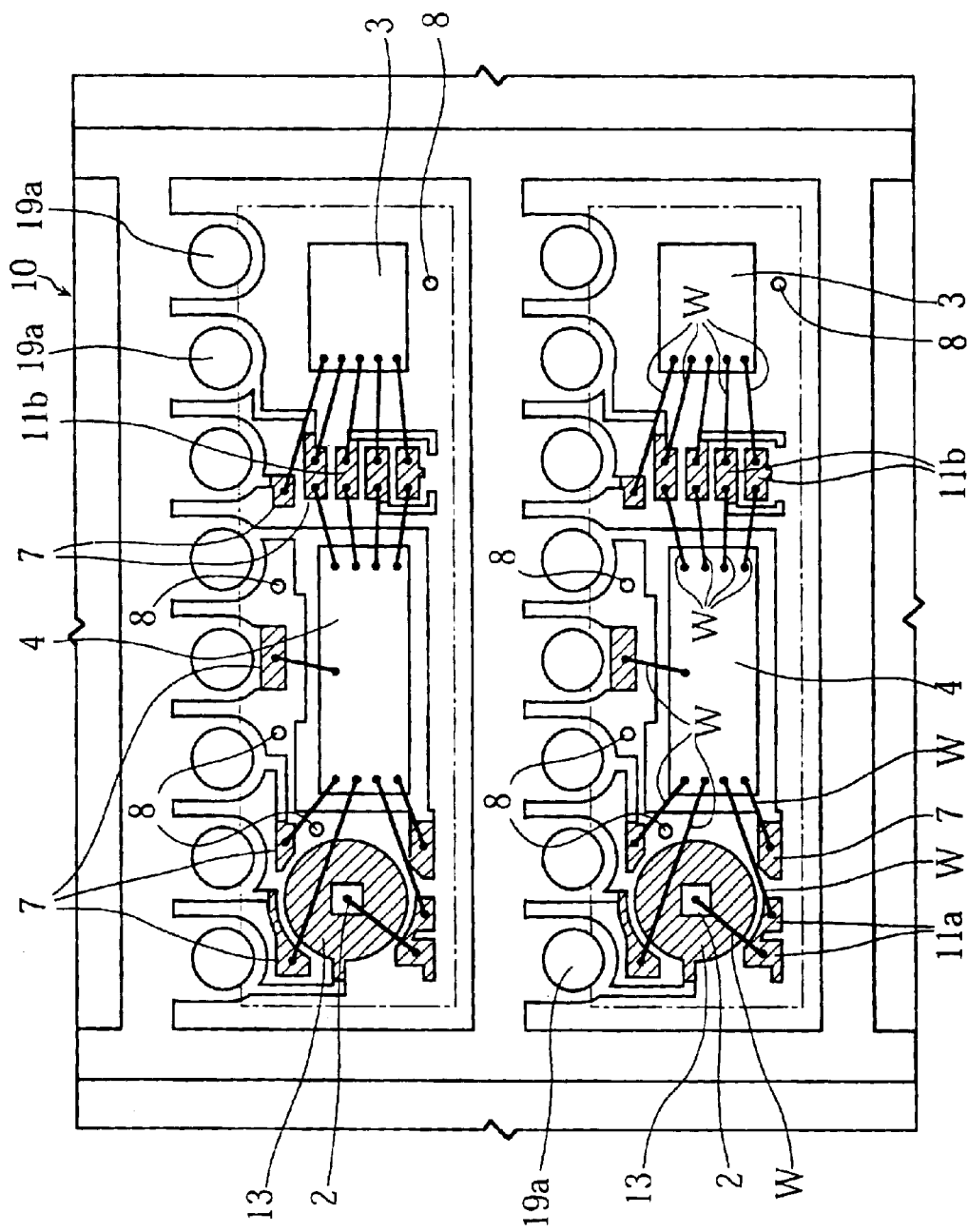
FIG. 14 is a schematic plan view illustrating the method of making an infrared data communication module according to the present invention.

Then, as shown in FIG. 13, the group E of components is mounted. In this process step, a light emitting element 2 is first bonded onto the die bonding pad 13. Specifically, the light emitting element 2 and the die bonding pad 13 may be bonded by heating under pressure or with the use of a conductive adhesive. At this time, since the die bonding pad 13 is larger than the bottom surface area of the light emitting element 2, the light emitting element 2 can be easily positioned. Before or after the bonding of the light emitting element 2, a light receiving element 3 and an IC chip 4 are bonded at predetermined positions. Then, as shown in FIG. 14, connection is provided between the light emitting element 2 and the jumper pad 11*a*, between the light receiving element 3 and the jumper pads 11*b*, and between the IC chip 4 and the jumper pads 11*a*, 11*b*, respectively via a gold wire or wires W. Specifically, each of the wires is first-bonded to a respective electrode of the light emitting element 2, the light receiving element 3, or the IC chip 4 and is second-bonded to the jumper pad 11*a* or 11*b*. At this time, the light receiving element 3 and the IC chip 4 are also connected to the wire bonding pad or pads 7 by wiring.

In this way, since each of the elements 2, 3, 4 is second-bonded to the jumper pad 11*a* or 11*b* formed on the material board 10, it is possible to prevent the breakage of the element by a capillary during wire bonding. Moreover, since the jumper pads 11*a*, 11*b* are formed by plating a conductor film with gold as described above, the jumper pads have good conductivity with the gold wires W, so that a good conductivity can be provided between the electronic elements 2, 3, 4. Further, in the case where each of the jumper pads 11*a*, 11*b* is made to have a larger area than the electrodes of the electronic elements 2, 3, 4, a large contact area can be provided in bonding the gold wire W to the jumper pads 11*a*, 11*b* under pressure. As a result, the data communication property of the module A can be prevented from deteriorating.

Subsequently, protective members 6 are formed to cover the light emitting element 2, the light receiving element 3 and the IC chip 4, respectively. Specifically, a resin material such as a silicone resin in a gel state is applied to each of the elements 2, 3, 4 to cover these elements using a nozzle capable of discharging such a resin material. At this time, care should be taken not to allow the resin material to flow into the recesses 8 formed in the foregoing step. Thereafter, the applied resin material is heated to a predetermined temperature for hardening, thereby providing the protective members 6.

Figure 15:
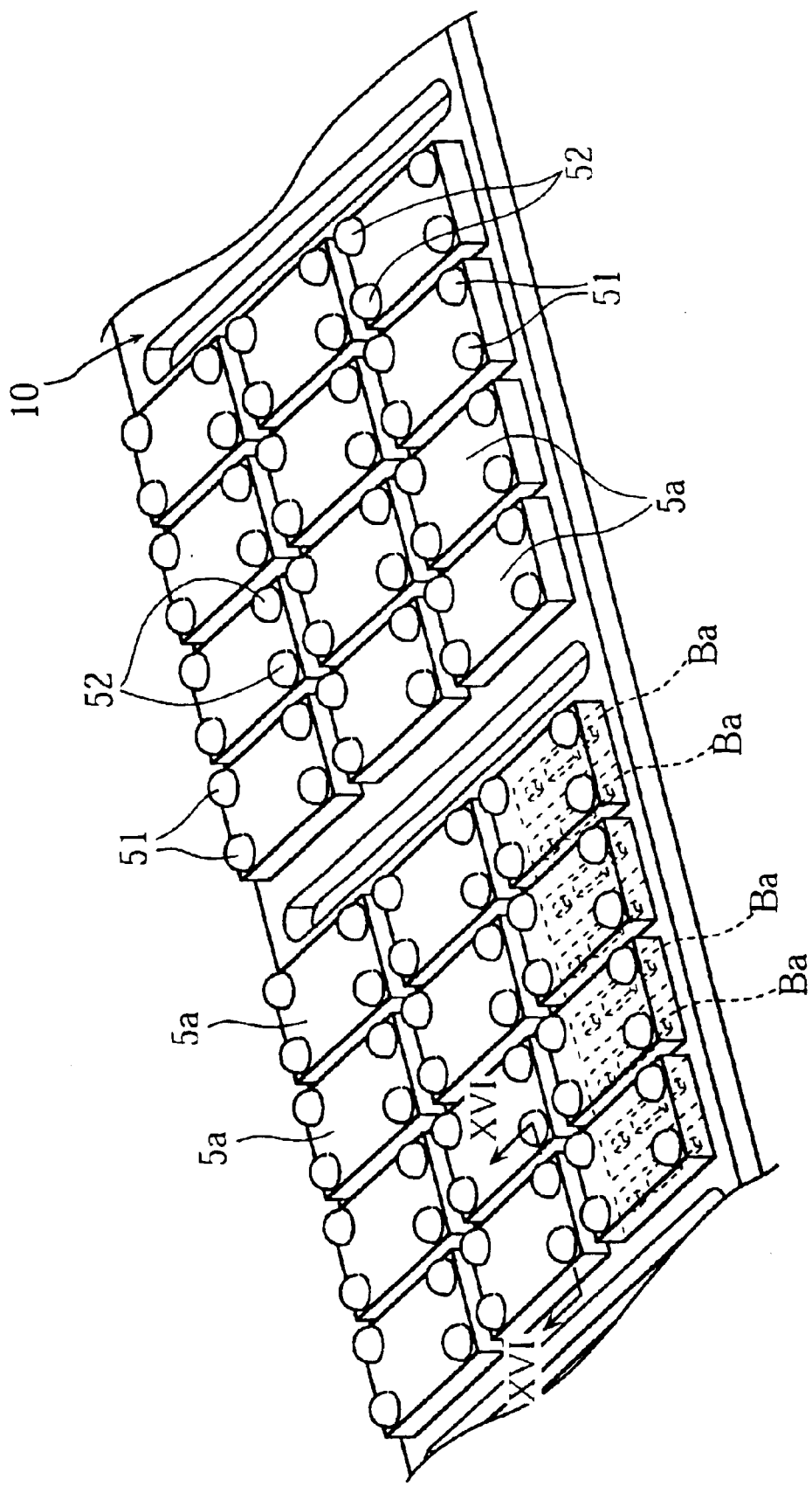
FIG. 15 is a schematic perspective view illustrating the method of making an infrared data communication module according to the present invention.

Subsequently, a molded body 5 is formed on the material board 10. In this step, a transparent molding resin such as an epoxy resin is formed, by transfer molding using a predetermined mold, into bodies each of which is larger, in plan view, than each substrate area Ba for sealing the group E of components including the light emitting element 2, the light receiving element 3 and the IC chip 4 respectively covered with the protective members 6. In this embodiment, as shown in FIG. 15, intermediate sealing bodies 5*a* are formed by molding, each of which collectively seals two adjacent substrate areas Ba. At this time, the mold has generally semispherical cavities for forming generally semispherical light emitting lenses 51 and light receiving lenses 52 integrally on the upper surface of each intermediate sealing body 5*a* in facing relationship to the light emitting elements 2 and the light receiving elements 3, respectively.

At this time, the molding resin flows into each of the recesses 8 formed on the surface 1*a* of the substrate 1. Thus, the molding resin trapped in the recess 8 hardens integrally with the molded body 5.

Figure 16:
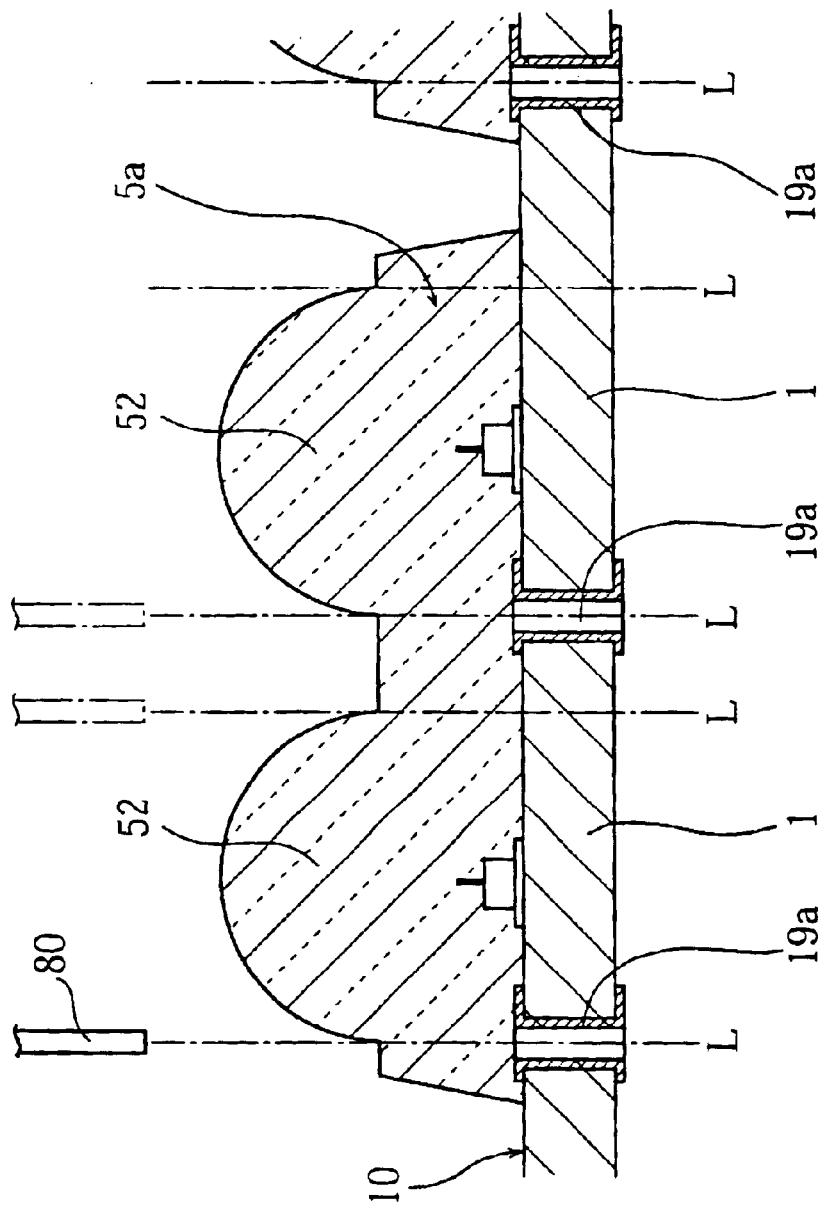
FIG. 16 is a sectional view taken along lines XIX—XIX of FIG. 15.
Figure 17:
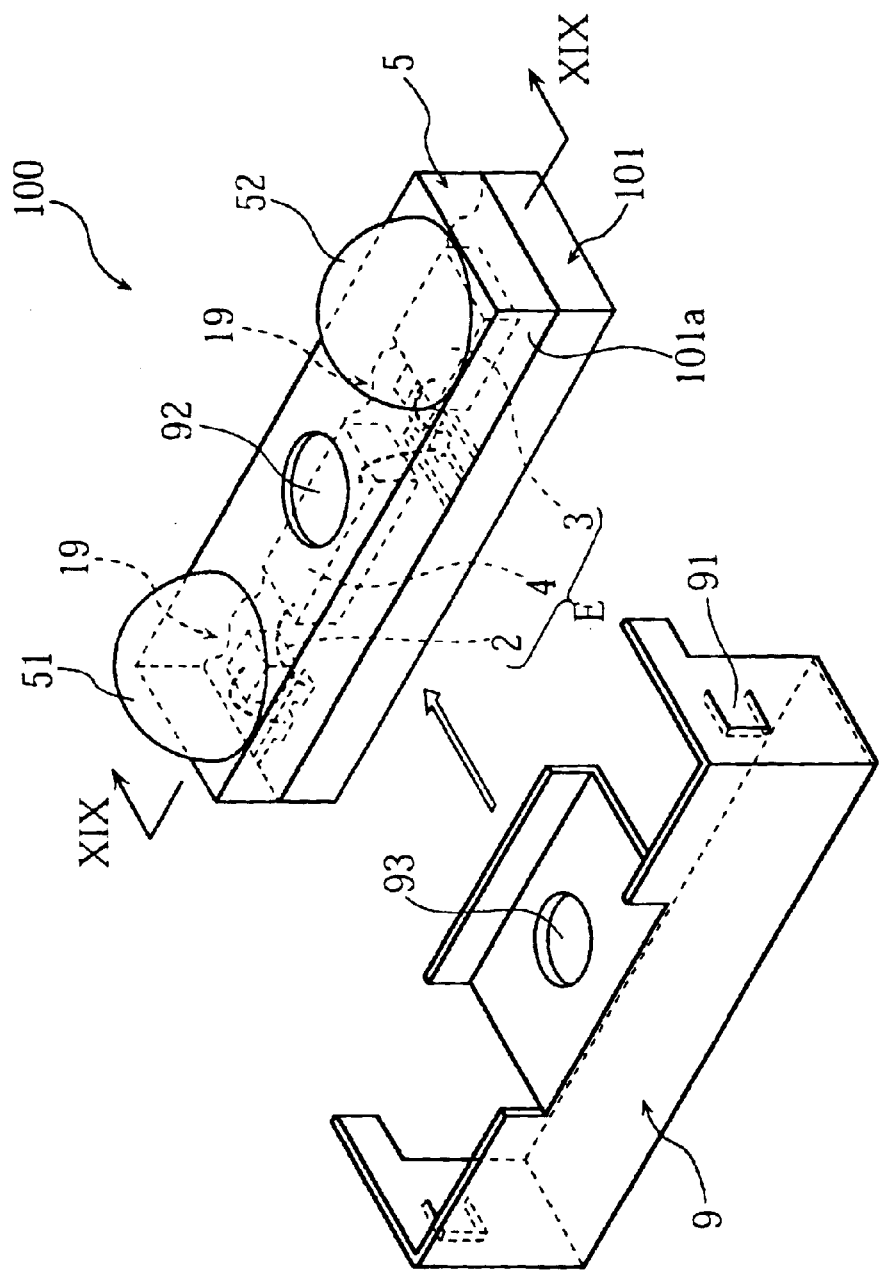
FIG. 17 is a schematic perspective view showing a prior art infrared data communication module.
Figure 18:
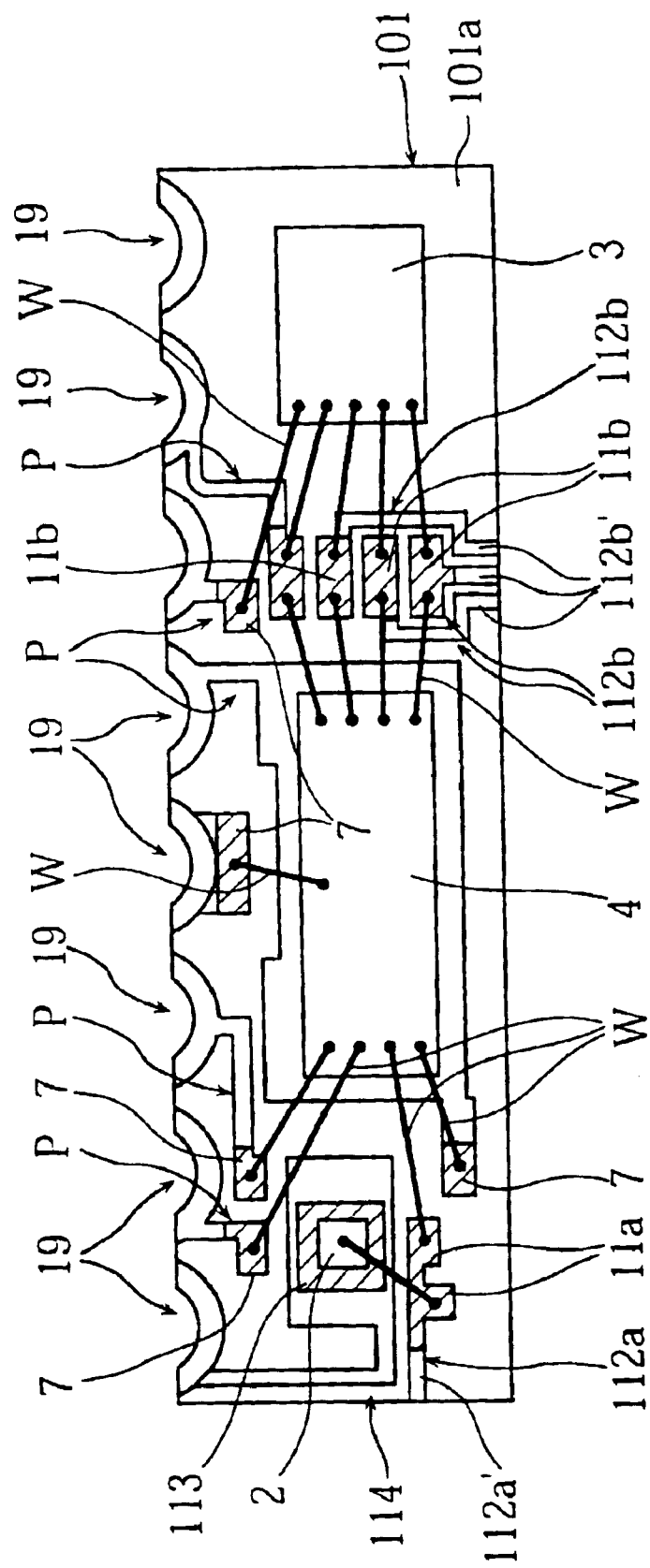
FIG. 18 is a plan view showing an internal structure of the infrared data communication module shown in FIG. 17.
Figure 19:
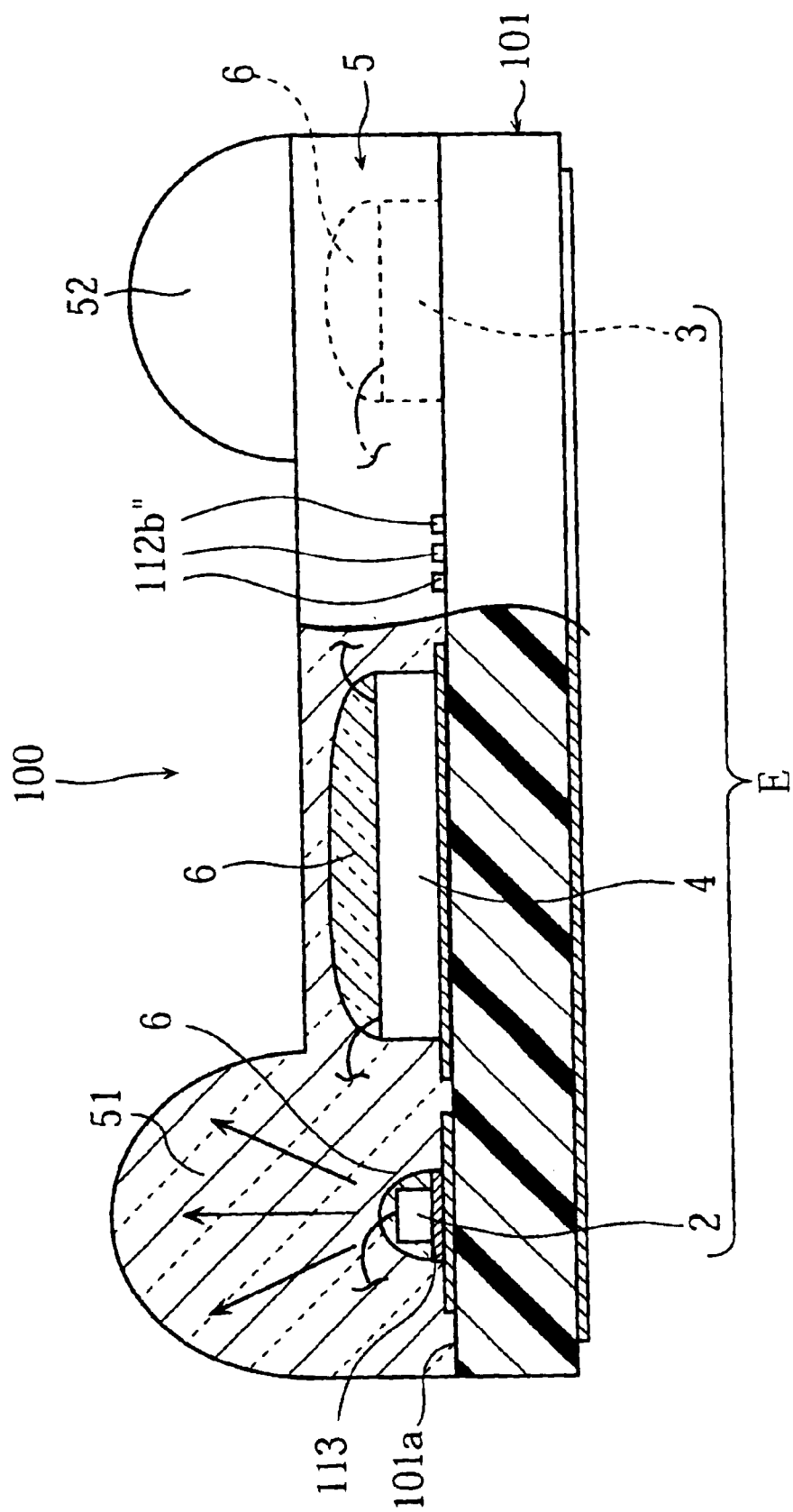
FIG. 19 is a sectional view taken along lines XIX—XIX of FIG. 17.
Figure 20:
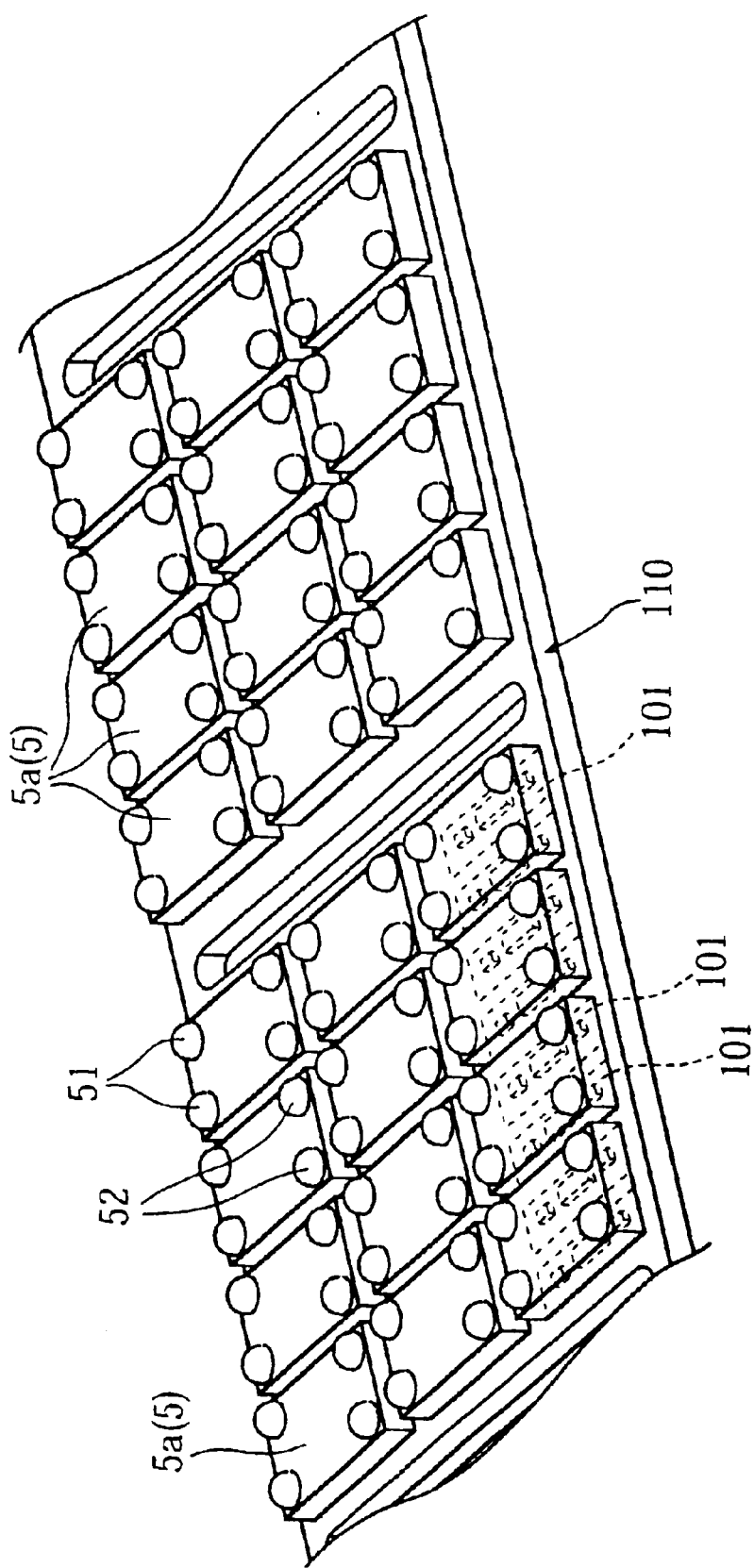
FIG. 20 is a schematic perspective view showing a prior art method of making an infrared data communication module.

Thereafter, the material board 10 is cut along each of the substrate areas Ba. Specifically, the board 10 is first cut longitudinally of the substrate 1 along chain lines L shown in FIG. 16. In cutting the material board 10, use may be made of a circular blade 80 having a thickness of about 0.35 mm for example to cut the intermediate sealing bodies 5*a* together with the material board 10, as shown in FIG. 16. At this time, each of the through-holes 19*a* is cut axially to provide a terminal 19 of the substrate 1. By the following widthwise cutting of the substrate 1, a plurality of modules A are obtained.

In the module A formed in the above-described manner, the jumper pads 11*a*, 11*b* are formed as spaced from the edges of the substrate 1. Therefore, it is possible to prevent the ends of the jumper pads 11*a*, 11*b* from being exposed at the side surfaces of the module A, or specifically, at the boundary between the substrate 1 and the molded body 5. Therefore, even when a shield case 9 is attached to the module A, the jumper pads 11a and 11b do not contact the flat vertical wall 90 or the second bent portion 90b of the shield case 9. As a result, unlike the prior art module, the jumper pads 11a and 11b are prevented from being electrically connected to each other via the shield case 9, which leads to the prevention of short-circuiting. Moreover, also before the shield case 9 is attached, the IC chip 4 in the module A is prevented from suffering electrostatic breakdown due to contact with an external object (such as an operator's hand).

As described above, in forming the molded body 5, the molding resin trapped in each of the recesses 8 hardens integrally with the molded member 5. Therefore, the molding resin hardened in the recess 8 provides so-called anchoring effect, thereby enhancing the mechanical bonding strength between the substrate 1 and the molded body 5. Further, since the provision of the recess 8 on the surface 1a of the substrate 1 increases the surface area of the substrate 1, the contact area between the substrate 1 and the molded body 5 also increases. As a result, the bonding between the substrate and the molded body 5 is further enhanced. Therefore, even if the resin material for the protective members 6 spreads over the substrate 1 to some extent as in the prior art, the molded resin hardened in the recess 8 functions to prevent the deterioration of the bond between the substrate 1 and the molded body 5. Thus, the removal of the molded body 5 from the substrate 1 at the interface can be prevented, which leads to the prevention or suppression of the resulting breakage of the gold wires W or removal of the group E of components. Thus, owing to the provision of the recess 8, the module A thus provided has a high reliability.

Next, the transmitting operation of the module A will be described. First, light is emitted through the upper surface and side surfaces of the light emitting element 2. The light emitted through the upper surface of the light emitting element 2 travels upward to enter the light emitting lens 51. As described above, in the module A, the die bonding pad 13 on which the light emitting element 2 is mounted has an area which is larger than the bottom surface area of the light emitting element 2. Therefore, as shown in FIG. 2, part of the light emitted through the side surfaces of the light emitting element 2 can be reflected upward. Thus, in addition to the light emitted through the upper surface of the light emitting element 2, the light emitted through the side surfaces of the light emitting element 2 can enter the light emitting lens 51. Therefore, the light emitted from the light emitting element 2 can be utilized effectively. Furthermore, since the die bonding pad 13 is generally circular, the light emitted from the light emitting element 2 and reflected by the conductive pad conically flares before entering the light emitting lens 51. Therefore, the light emitted from the module A conically flares toward the outside so that the light is rotationally equalized around the optical axis.

The present invention being thus described, it is apparent that the same may be varied in many ways. Such variations should not be regarded as a departure from the spirit and scope of the present invention, and all such modifications as would be obvious to those skilled in the art are intended to be included within the scope of the following claims.

What is claimed is:

1. An infrared data communication module comprising:
a substrate having a surface provided with a die bonding pad that includes a conductive film and a sold layer formed on the conductive film by plating the film with gold; and
a light emitting element mounted on the die bonding pad;
wherein the die bonding pad is generally circular as viewed in plan and having an area larger than a bottom surface area of the light emitting element, the pad layer of the pad being exposed for reflecting light emitted from the light emitting element.

2. An infrared data communication module comprising:
a substrate having a surface for mounting a light emitting element, a light receiving element and an IC element;
a protective member for covering each of the elements; and
a molded body formed of a molding resin on said surface of the substrate to cover the protective member;
wherein said surface of the substrate is formed with a recess for enhancing bonding between the substrate and the molded body, the recess being completely filled with part of the molded body alone.

3. The infrared data communication module according to claim 2, wherein the recess is formed on said surface of the substrate at each of plural portions which avoid the protective member.

4. The infrared data communication module according to claim 2, wherein the recess is generally cylindrical.

5. A method of making infrared data communication modules, each of which comprises a substrate having a surface for mounting a group of components which includes a light emitting element, a light receiving element and an IC element, and a molded body formed of a molding resin to entirely cover said surface of the substrate for sealing the group of components, said surface of the substrate being formed with at least one jumper pad formed by plating a conductive film with gold, the method comprising the steps of:
forming a conductive film on an entire surface of a material board including substrate areas which later provide substrates;
etching the conductive film to form a plating conductive pattern which later provides jumper pads;
applying a gold foil on the plating conductive pattern by electroplating at jumper pad regions which correspond to the jumper pads;
removing a connecting portion of the plating conductive pattern extending from an edge of each substrate area to outside of the substrate area;
mounting groups of elements;
shaping a molding resin into molded bodies on the material board; and
dividing the material board along each of the substrate areas.

6. A method of making an infrared data communication module which comprises a substrate having a surface for mounting a group of components including a light emitting element, a light receiving element and an IC element, and a molded body formed of a molding resin to seal the group of components, the method comprising the steps of:
forming a recess on said surface of the substrate for enhancing bonding between the substrate and the molded body before the group of components is mounted on the substrate; and forming the molded body so that the molding resin is trapped and hardened in the recess after the group of components is mounted on the substrate, the recess being completely filled with the molding resin alone.

* * * * *